(12) United States Patent
Leung et al.

(10) Patent No.: US 11,217,751 B2
(45) Date of Patent: Jan. 4, 2022

(54) CRYSTAL CONTROL AND STABILITY FOR HIGH-PERFORMANCE PEROVSKITE SOLAR CELL

(71) Applicant: The Hong Kong Polytechnic University, Hong Kong (HK)

(72) Inventors: Wallace Woon-Fong Leung, Hong Kong (HK); Jingchuan Wang, Hong Kong (HK); Lijun Yang, Hong Kong (HK)

(73) Assignee: THE HONG KONG POLYTECHNIC UNIVERSITY, Hong Kong (CN)

( * ) Notice: Subject to any disclaimer, the term of this patent is extended or adjusted under 35 U.S.C. 154(b) by 99 days.

(21) Appl. No.: 14/676,828

(22) Filed: Apr. 2, 2015

(65) Prior Publication Data

US 2015/0287852 A1    Oct. 8, 2015

Related U.S. Application Data

(60) Provisional application No. 61/974,988, filed on Apr. 3, 2014.

(51) Int. Cl.
| | | |
|---|---|---|
| *H01L 31/032* | (2006.01) | |
| *B05D 1/18* | (2006.01) | |
| *B05D 1/00* | (2006.01) | |
| *H01L 51/00* | (2006.01) | |
| *H01L 51/42* | (2006.01) | |

(52) U.S. Cl.
CPC ...... *H01L 51/0032* (2013.01); *H01L 51/4226* (2013.01); *Y02E 10/549* (2013.01)

(58) Field of Classification Search
CPC .................. H01L 51/0032; H01L 51/4226
See application file for complete search history.

(56) References Cited

U.S. PATENT DOCUMENTS

2010/0269270 A1* 10/2010 Ma .................. H01G 9/2031
8/495

OTHER PUBLICATIONS

Wang, et al., Journal of Membrane Science, 2009, vol. 345, pp. 65-73.*
Lee, et al., Science, 2012, vol. 338, pp. 644-647.*
Evidentiary reference: "Methylamine Density".*
Evidentiary reference: "Ethanol Density".*
Evidentiary reference: "HI density".*
Dharani, et al., Nanoscale, 2009, vol. 6, pp. 1675-1679.*
Wang, et al., Nano Letters, 2014, vol. 14, pp. 724-730, published online Dec. 16, 2013.*

(Continued)

*Primary Examiner* — Sadie White
(74) *Attorney, Agent, or Firm* — Spruson & Ferguson (Hong Kong) Limited

(57) ABSTRACT

$PbI_2$ thin film crystallization control is prerequisite of high-quality perovskite layer for the sequentially solution-processed perovskite solar cells. According to the present invention, an efficient-and-simple method has been developed by adding halogen acid additive to improve perovskite thin-film quality and an efficiency of at least 15.2% is obtained. This approach improves coverage, uniformity and stability of pervoskite thin-film. In addition, a nanofiber scaffold is incorporated into the perovskite layer so as to reduce the amount of grain boundaries, thus substantially reducing electron recombination within these boundaries.

2 Claims, 17 Drawing Sheets

(56) References Cited

OTHER PUBLICATIONS

Im, et al., Nanoscale, 2011, vol. 3, pp. 4088-4093.*
Burschka, et al., Nature, 2013, vol. 499, pp. 316-320 (Year: 2013).*
Artemyev, Journal of Crystal Growth, 1997, vol. 171, pp. 447-452 (Year: 1997).*
Eperon, et al., Energy and Environmental Science, 2014, vol. 7, pp. 982-988 (Year: 2014).*
Colella, et al., Chemistry of Materials, 2013, vol. 25, pp. 4613-4618 (Year: 2013).*
Noh, et al., Nano Letters, 2013, vol. 13, pp. 1764-1769 (Year: 2013).*
Eperon, et al., Energy and Environmental Science, 2014, vol. 7, pp. 982-988, and its corresponding Supplemental Information (Year: 2014).*
Stranks, et al., Science, 2013, vol. 342, pp. 341-344, and its corresponding Supplemental Information (Year: 2013).*
Stranks et al., "Electron-hole diffusion lengths exceeding 1 micrometer in an organometal trihalide perovskite absorber", Science, vol. 342, Oct. 18, 2013.
Burschka et al., "Sequential deposition as a route to high-performance perovskite-sensitized solar cells", Nature Letters, vol. 499, Jul. 18, 2013.
Green, M. A. et al. Solar Cell Efficiency Tables (Version 45). Prog. Photovolt: Res. Appl., vol. 23, Jan. 2015.
Kelly et al., "Perovskite solar cell with a planar heterojunction structureprepared using room-temperature solution processing techniques", Nature Photonics, vol. 8, Feb. 2014.

\* cited by examiner

CRYSTAL CONTROL AND STABILITY FOR HIGH-PERFORMANCE PEROVSKITE SOLAR CELL

CROSS REFERENCE TO RELATED APPLICATION

Pursuant to 35 U.S.C. § 119(e), this is a non-provisional patent application which claims benefit from U.S. provisional patent application Ser. No. 61/974,988 filed Apr. 3, 2014, and the disclosure of which is incorporated herein by reference.

FIELD OF THE INVENTION

The present invention relates to perovskite solar cells. More particularly, the present invention provides methods for fabricating perovskite solar cells.

BACKGROUND

Thin-film photovoltaic cells based on perovskite absorbers (hereafter referred as perovskite solar cell) have excellent power conversion. The power conversion efficiency (PCE or η) is defined as the output to the input power by the relationship as follows:

$$\eta = \frac{J_{sc}V_{oc}FF}{P_{in}}$$

where $J_{sc}$ is the short-circuit current density, mA/cm$^2$; $V_{oc}$ is the open-circuit voltage, V; FF is the fill factor; and $P_{in}$ is the input power in Watt.

The best is to visualize the architecture perovskite solar cell as shown in FIG. 1. Attached to the FTO glass is a thin $TiO_2$ dense layer. After the dense layer is applied, it is being heat treated at 200-300° C. for 3 h. Subsequently, the perovskite layer with approximately 300 to 500 nm is applied onto the dense layer. After curing, a hole transfer layer, such as a spiro-OMeTAD, is laid onto the perovskite layer. Finally, a counter electrode is applied. In FIG. 1, a $Mo_2O_3$ layer is inserted between the silver counter-electrode with the hole transfer layer to improve hole transport while blocking electron transport, thereby reducing electron recombining at the counter-electrode, which reduces efficiency of the cell.

There are two common configurations. For the first configuration, the perovskite is in form of a solid layer [1] in planar heterojunction architectures. For the second configuration, the perovskite is housed in a mesoporous scaffold. For the scaffold type, Burschka et al. [2] have demonstrated 15% efficiency. For the solid-layer, an efficiency of 20.1% has been demonstrated recently [3] for the perovskite solar cell. What has been discussed so far is known and also represents the state-of-the-art. There are several shortcomings for which the performance of both the solid-layer configuration as well as the scaffold configuration perovskite solar cells can be further benefited.

Consequently, there is an unmet need to a simple method for fabricating a perovskite solar cell with higher power conversion efficiency.

SUMMARY OF THE INVENTION

Accordingly, a first aspect of the presently claimed invention is to provide a method for fabricating an inorganic-organic perovskite layer.

According to an embodiment of the presently claimed invention, a method for fabricating an inorganic-organic perovskite layer comprises: mixing at least one inorganic part perovskite solution with at least one halogen acid additive to form an inorganic mixture; coating the inorganic mixture on an electron-transport substrate; drying the inorganic mixture on the substrate to form an inorganic part perovskite layer; disposing at least one organic part perovskite solution on the inorganic part perovskite layer; and heating the organic part perovskite solution to react with the inorganic part perovskite layer to form the inorganic-organic perovskite layer.

Preferably, the inorganic part perovskite solution is formed by mixing an inorganic part perovskite material with a solvent, and the halogen acid additive improves the solubility of the inorganic part perovskite material in the solvent.

Preferably, the inorganic part perovskite layer comprises a plurality of hexagonal-plate shaped inorganic part perovskite crystals having an aspect ratio of maximum and minimum diameters with a range of 0.4 to 1.6.

Preferably, the method further comprises: rinsing unreacted organic part perovskite solution with a solvent solution.

Preferably, the inorganic part perovskite solution is lead (II) iodide ($PbI_2$) solution or tin (II) iodide ($SnI_2$) solution, and the organic part perovskite solution is methylammonium iodide, abbreviated as MAI, ($CH_3NH_3I$), and the substrate is a semiconductor dense layer for electron transport. More preferably, the substrate is a titanium dioxide dense layer or a zinc oxide dense layer.

Preferably, the halogen acid additive is hydrochloric acid, hydriodic acid, or hydrobromic acid. A volume ratio of the halogen acid additive to the inorganic part perovskite solution is in a range of 1:100 to 1:10. More preferably, the volume ratio is 1:40.

Preferably, the inorganic mixture is dried on the substrate in a range of 50 to 90° C., and subsequently the organic part perovskite solution is heated on the dried inorganic mixture in a range of 70 to 95° C. The temperature range is able to provide enough heat energy to speed up the reaction but not exceeding 100° C., otherwise evaporation of water-based solvent, or solvent with low boiling point occurs. Preferably, the inorganic mixture is dried on the substrate at 70° C. for 30 min, and the organic part perovskite solution is heated on the dried inorganic mixture at 90° C. for 2 hr.

Preferably, wherein the inorganic mixture is coated on the substrate by spin-coating or dipping. The spin-coating comprises a speed in a range of 500 to 10,000 revolutions per minute. More preferably, the spin-coating comprises a speed in a range of 1,000 to 3,000 revolutions per minute.

A second aspect of the presently claimed invention is to provide a perovskite material.

According to an embodiment of the presently claimed invention, a perovskite material comprises at least one halogen acid additive. The perovskite material is more stable to humid environment after incorporation of the additive.

Preferably, the halogen acid additive is hydrochloric acid, hydriodic acid, or hydrobromic acid, and comprises a concentration in a range of 0.1 to 10 wt %. More preferably, the concentration is 1.3 wt %.

A third aspect of the presently claimed invention is to provide a scaffold perovskite layer.

According to an embodiment of the presently claimed invention, a scaffold perovskite layer comprises: at least one perovskite material; a plurality of fibers; and a plurality of pores; wherein the fibers are intertwined with each other to form a scaffold with the pores; and wherein the pores are filled with the perovskite material.

Preferably, the fibers comprise at least one semiconductor material or at least one inert material. The semiconductor material includes titanium dioxide ($TiO_2$), zinc oxide (ZnO), tin dioxide ($SnO_2$) or bismuth (III) oxide ($Bi_2O_3$), and the inert material includes aluminum oxide ($Al_2O_3$). The inert material has wide band gap to improve charge separation.

Preferably, the fibers are incorporated with at least one carbon material. The carbon material includes a carbon nanotube (single- or multi-wall), a graphene sheet, or a carbon nanowire.

Preferably, each of the fibers comprises a diameter in a range of 10 to 1000 nm. More preferably, each of the fibers comprises a diameter in a range of 30 to 300 nm. The size of the pores is in a range of 1000 to 20000 nm.

According to the present invention, a simple and efficient method has been developed to improve the quality of perovskite thin film through manipulating $PbI_2$ thin film crystallization and growth by introducing halogen acid additives, i.e. HCl, HBr and HI. With 2.5 v. % HI additive, 30% PCE improvement can be obtained in planar heterojunction perovskite solar cell; while with 2.5 v. % HCl additive, a high efficiency of 15.2% can be obtained, which represents a 58% enhancement. The additives, i.e. HCl and HI, especially HCl, not only improves the perovskite thin film uniformity and coverage on the $TiO_2$ dense layer but also crystallinity and stability. The latter is an extremely attractive benefit for organic-inorganic hybrid perovskite PV applications.

BRIEF DESCRIPTION OF THE DRAWINGS

Embodiments of the present invention are described in more detail hereinafter with reference to the drawings, in which.

DETAILED DESCRIPTION OF PREFERRED EMBODIMENTS

In the following description, perovskite solar cells, and methods for fabricating the perovskite solar cells are set forth as preferred examples. It will be apparent to those skilled in the art that modifications, including additions and/or substitutions, may be made without departing from the scope and spirit of the invention. Specific details may be omitted so as not to obscure the invention; however, the disclosure is written to enable one skilled in the art to practice the teachings herein without undue experimentation.

The objective in this present invention is to obtain a high-quality perovskite thin film, using a two-step solution deposition process attaining a thin film with quality comparable to that obtained from an elaborate, more expensive, small-scale production procedure—vapor deposition. In conjunction, a systematical investigation on the effect of halogen acid additives has been launched, i.e. hydroiodic acid (HI) and hydrochloric acid (HCl), on (i) $PbI_2$ crystallization, (ii) perovskite morphology, (iii) device performance, and (iv) stability of the solar cell. It is demonstrated with a simple means of incorporating HCl into $PbI_2$ precursor solution; with consequence that HCl inhibits the rod-shape $PbI_2$ crystallization and promotes homogenous nucleation and crystal growth, which further improves uniformity and coverage of the perovskite thin film on the dense $TiO_2$ layer. With simple HCl additive, a high efficiency of 15.2% has been attained with the planar-heterojunction perovskite solar cell under AM1.5G standard solar simulation with excellent device stability even in an environment with relative humidity (RH %) in excess of 80% at room temperature.

Instead of a one-step solution phase approach, the present invention adopts a two-step solution process method to fabricate the perovskite layer $CH_3NH_3PbI_3$.

Figure 2:
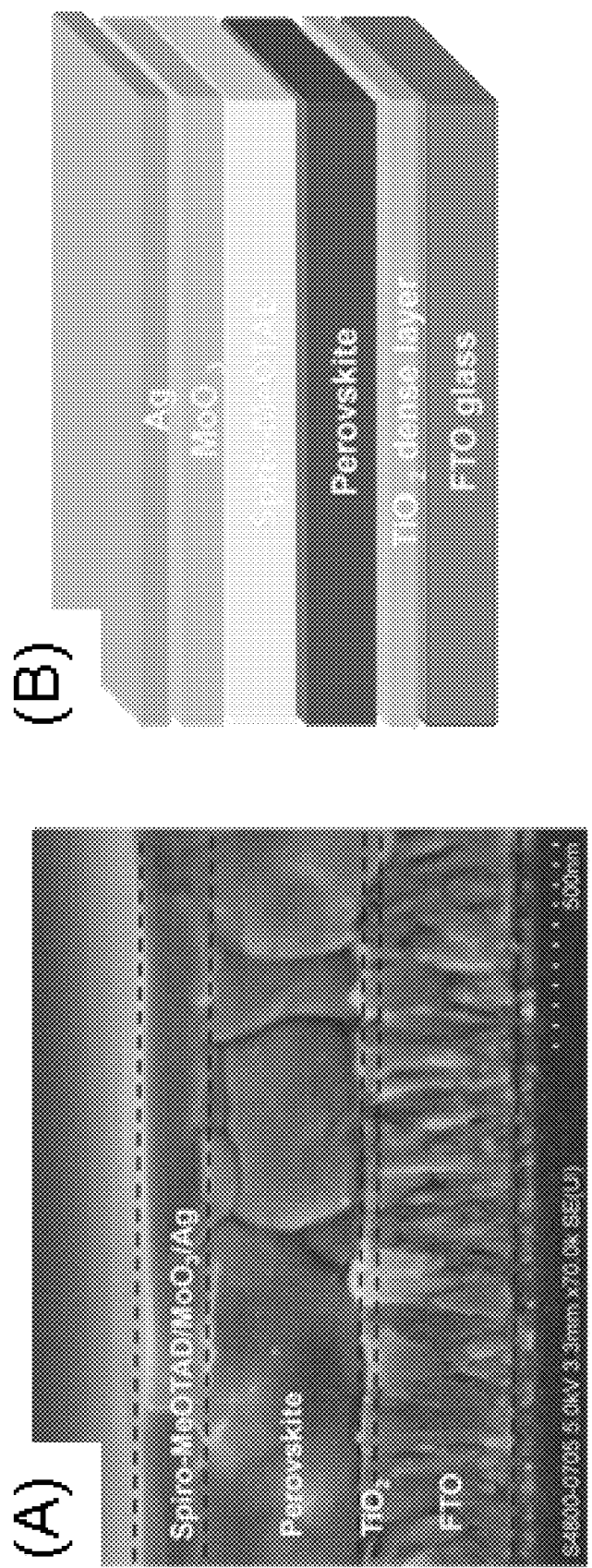
FIG. 2 shows a device configuration of the planar heterojunction perovskite solar cell adopted: (A) a cross-section SEM of the solar cell, and (B) a device architecture according to an embodiment of the presently claimed invention.

According to an embodiment of the presently claimed invention, a liquid drop of the $PbI_2$ solution is deposited and spin-coated onto a well-prepared $TiO_2$ dense layer, i.e., electron transfer layer (ETL), pre-coated on the laser-pattern FTO glass. This is followed by immersion of the dried substrate in a $CH_3NH_3I$ solution. Subsequently, a hole transfer layer (HTL) composed of Spiro-MeOTAD is spin-coated onto the perovskite thin film. Lastly, the $MoO_3$ and Ag were evaporated onto the HTL to form an electron blocking layer and a counter electrode, respectively, thereby completing the device. FIGS. 2A and 2B are the cross-section SEM image of the perovskite solar cells and the related device architecture, respectively. The interfacial $MoO_3$ layer was used to strengthen the electron blocking effect as it has an aligned energy level and is also an environmental inert material. The thickness of perovskite layer is about 350 to 450 nm. Of great interest is that the entire crystalline grain, sandwiching between HTL and ETL, is a single crystal in an uni-direction. This is also along the electron/hole transport without additional boundaries that can lead to undesirable scattering effect and electron-hole recombination taking place at grain boundaries as the charge carriers are transported across the two electrodes.

Figure 3:
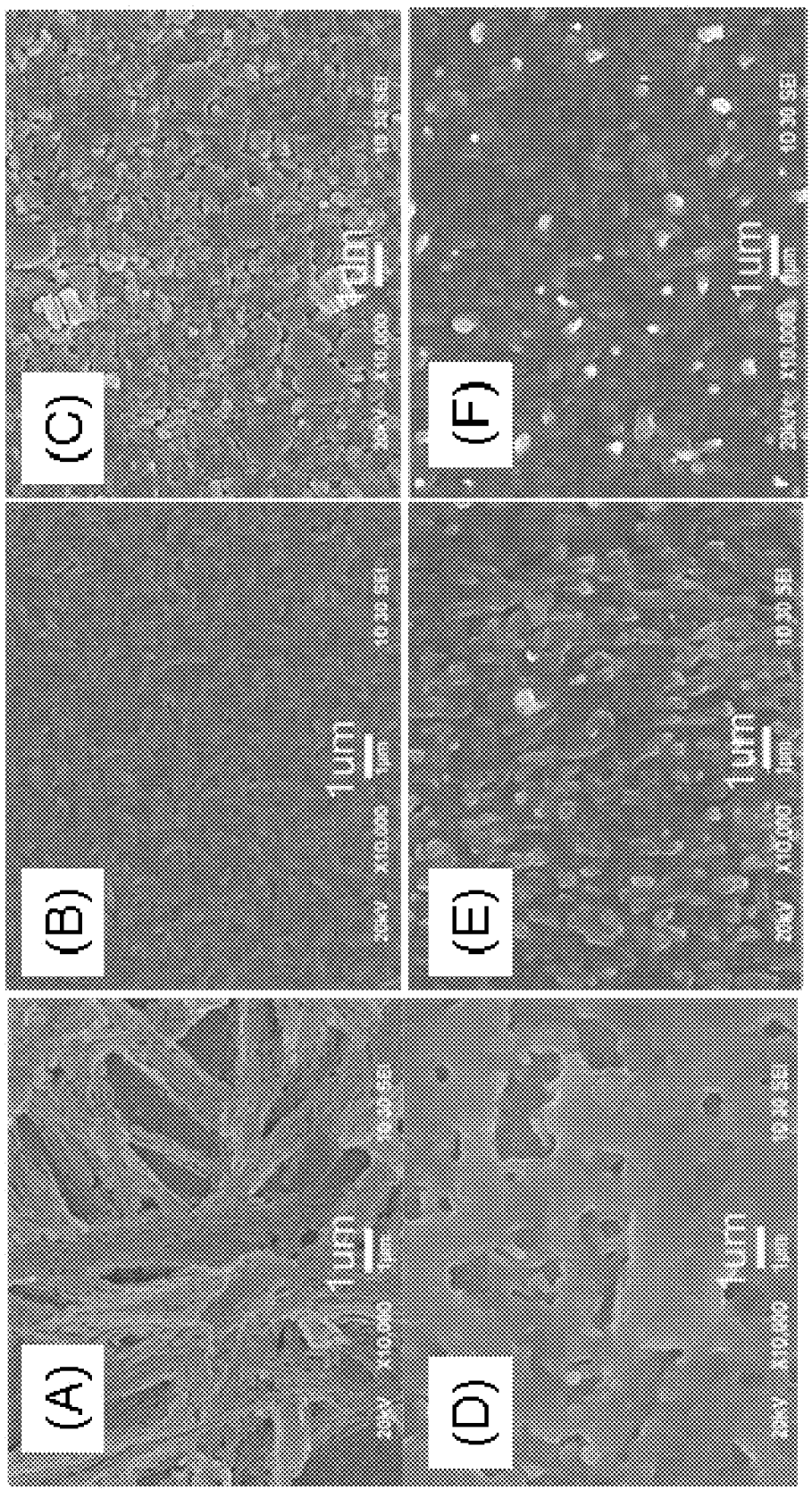
FIG. 3 shows topographic SEM images of $PbI_2$ thin film and corresponding perovskite layers: (A) pristine $PbI_2$, (B) $PbI_2$ with HI, and (C) $PbI_2$ with HCl on the $TiO_2$ dense layer coated FTO; (D) $CH_3NH_3PbI_3$, (E) $CH_3NH_3PbI_3$+HI, and (F) $CH_3NH_3PbI_3$+HCl, after sequentially reacting, respectively, with $CH_3NH_3I$ according to an embodiment of the presently claimed invention.
Figure 4:
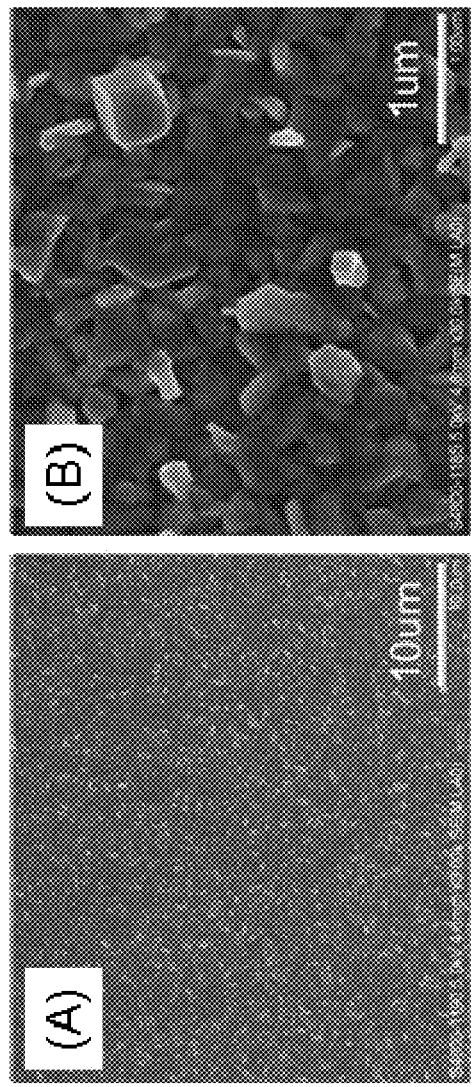
FIG. 4 shows top-view SEM images for the solution-processed perovskite thin film with HCl additive on the $TiO_2$ dense layer: (A) a large scale SEM, and (B) a high resolution SEM according to an embodiment of the presently claimed invention.

According to the present invention, a well-controlled, two-step sequential deposition route is taken to prepare controlled perovskite crystals thereby improving the morphology of perovskite thin film. In the first step, the mechanism of crystallization (size and shape of crystals) of $PbI_2$ thin film is controlled by using halogen acid influencing the crystal growth; in particular inhibiting the linear growth along the $PbI_2$ axis but rather encouraging crystal growth along the entire boundary/periphery of the crystal in all directions (i.e., 360 degrees). The resulting hexagonal-plate shaped crystals of $PbI_2$ provide a uniform coverage of the $TiO_2$ dense layer. In the second step when the organic phase is introduced, a thin-film made of uniform-sized perovskite crystals forms providing excellent morphology and coverage of the dense $TiO_2$ layer. Both halogen acid additives, HCl and HI, are in the halogen family with advantage that they do not introduce alien atoms in the host matrix. The SEM images of $PbI_2$ thin films without and with additives and the corresponding perovskite layers are shown in FIGS. 3A-F. FIG. 3A is an image of $PbI_2$ thin film on the $TiO_2$ dense layer without additive, which serves as the benchmark. FIGS. 3B and 3C show the evolution of the $PbI_2$ thin film morphology on the $TiO_2$ dense layer after adding 2.5 vol % HI and HCl, respectively, to 1M $PbI_2$ solution. The material domain of $PbI_2$ crystal formed by "raw" $PbI_2$ solution has very large aspect ratio (Aspect ratio=$d_{max}/d_{min}$, with d being the characteristic dimension of the structure), which means the compactness, or coverage, of the thin film formed by these "rod-shaped" structures (one micron wide by tens of microns in length) cannot be high, providing at best 70-80% coverage of the $TiO_2$ dense layer (FIG. 3A). However, the coverage of the thin films can be remarkably improved by adding HI and HCl to the $PbI_2$ solution as the morphology of $PbI_2$ transforms from rod-shaped crystals into hexagonal-plate shaped crystals (FIGS. 3B and 3C). The compacted $PbI_2$ thin films cover most of $TiO_2$ dense layer, which benefits the morphology of the as-deposited perovskite thin film, shown in FIGS. 3E and 3F, respectively. Given the uniform shape (in all orientations) and size (one micron and less) of the perovskite crystals, the coverage of pristine perovskite thin film on the $TiO_2$ dense layer was increased from approximately 80% to 100%. It is worth noting that the quality of the solution-processed perovskite thin film can be comparable to that obtained by vapor deposition. As demonstrated by the large-scale SEM in FIGS. 4A-B, the absence of voids in the perovskite thin film with the HCl additive is in strong contrast to voids (or uncovered areas) present on the $TiO_2$ dense layer for the case without additives (FIGS. 3A and 3D). The voids affect significantly the performance of the thin-film solar cells since the defects/voids in the light absorption layer create serious short-circuiting and they also serve as trapping sites for electron-hole recombination.

Figure 5:
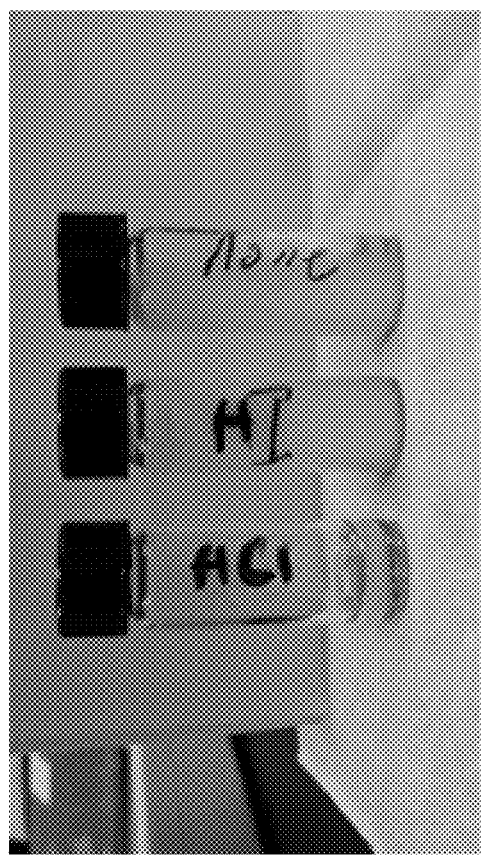
FIG. 5 shows a photograph of $PbI_2$ solutions (1M) at room temperature, respectively, treated with HCL, treated with HI, and untreated (control sample)

Using halogen acid additives in $PbI_2$ solution, the $PbI_2$ crystallization and growth in thin film can be controlled during spin-coating. The morphology of $PbI_2$ thin film is sensitive to the solution concentration and composition. Adding HI and HCl into $PbI_2$ in DMF solution can improve remarkably the solubility of $PbI_2$ in DMF solvent. Indeed, 1M of $PbI_2$ in DMF solution with 2.5 v % HCl additive can be kept stably over a week at room temperature. This contrasts with the pristine $PbI_2$ solution with an obvious crystallization over time. FIG. 5 shows the photograph of $PbI_2$ solutions (1M) treated with HCL, treated with HI, and untreated at room temperature, showing that the $PbI_2$ with HCl additive can maintain in clear liquid state for one week. In fact, this undersaturated $PbI_2$—DMF solution with HCl additive will slow down the crystallization rate that facilitates more homogenous nucleation and growth of the $PbI_2$ thin film. Furthermore, XRD patterns of $PbI_2$ thin film with and without additives are examined and shown in FIG. 6A. The crystals generated in the $PbI_2$ thin film with additives (both HI and HCl) oriented with the (001) plane that parallels to the substrate; while for $PbI_2$ thin film without additive, it can be observed that there is another peak originating from the (102) plane. Therefore, with additive, especially HCl, the crystallization and coverage of $PbI_2$ thin film can be improved, which subsequently improves the morphology of the perovskite thin film.

In the cases with addition of the HCl, rod-shaped PbI$_2$ crystals (without halogen acid) have been changed into hexagonal-plate-like crystals architecture. During spin-coating process, the rod-shaped crystallization from the supersaturation PbI$_2$ DMF solution with a high volatility is more likely formed from effect of centrifugal force, as shown in FIG. 3A. While with HCl additive, solvent evaporation dictates the PbI$_2$ crystallization from the undersaturated solution during and post spin-coating process; as a result, hexagonal-plate crystal architecture is formed as seen in FIG. 3C.

Figure 7:
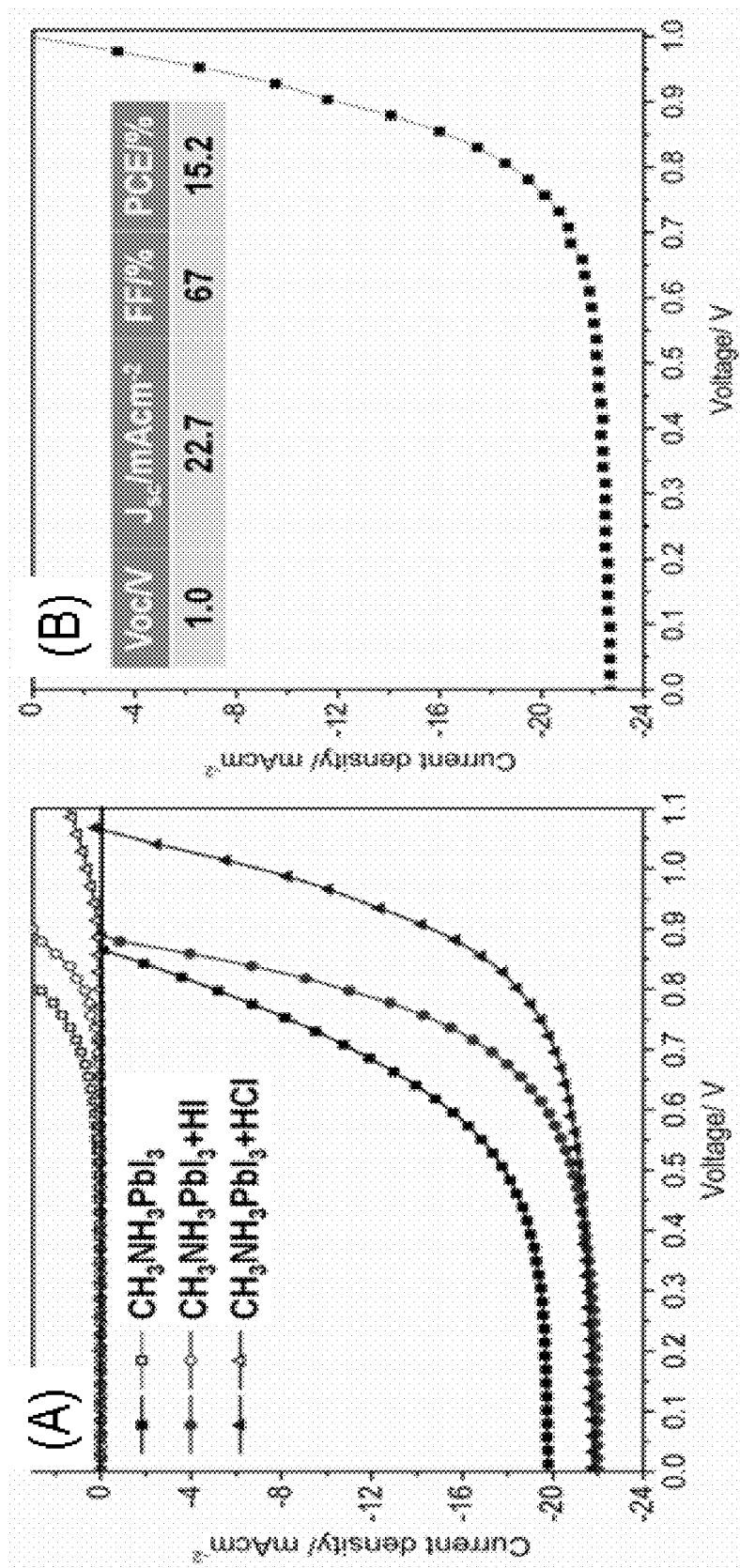
FIG. 7 shows (A) J-V curves measured under 100 mWcm$^2$ AM1.5G illumination (curves with solid symbols) and in the dark (curves with hollow symbols) for the perovskite, perovskite with HI and HCl added devices, and (B) J-V curve for the optimized device with HCl added according to an embodiment of the presently claimed invention.

The planar-heterojunction perovskite solar cells of pristine perovskite and perovskite with halogen acid additives, i.e. HI and HCl, have been fabricated. The best performing current density (J)-voltage (V) characteristics of the devices without and with additives are shown in FIG. 7A and related photovoltaic parameters are listed in Table 1. The average performance parameters are listed in Table 2.

TABLE 1

|  | $V_{oc}$ (V) | $J_{sc}$ (mAcm$^{-2}$) | FF (%) | PCE (%) | $J_{sc}$(mAcm$^{-2}$) obtained from EQE |
|---|---|---|---|---|---|
| CH$_3$NH$_3$PbI$_3$ | 0.87 | 18.94 | 57 | 9.4 | 17.5 |
| CH$_3$NH$_3$PbI$_3$ + HI | 0.89 | 22.02 | 62 | 12.2 | 20.48 |
| CH$_3$NH$_3$PbI$_3$ + HCl | 1.06 | 21.77 | 64 | 14.8 | 21.24 |

TABLE 2

|  | $V_{oc}$ (V) | $J_{sc}$ (mAcm$^{-2}$) | FF (%) | PCE (%) |
|---|---|---|---|---|
| CH$_3$NH$_3$PbI$_3$ | 0.86 ± 0.04 | 19.56 ± 2.13 | 56 ± 2 | 9.35 ± 0.35 |
| CH$_3$NH$_3$PbI$_3$ + HI | 0.84 ± 0.04 | 21.87 ± 1.11 | 61 ± 1 | 11.60 ± 0.63 |
| CH$_3$NH$_3$PbI$_3$ + HCl | 1.04 ± 0.02 | 21.62 ± 0.59 | 58 ± 6 | 13.99 ± 0.82 |

Figure 8:
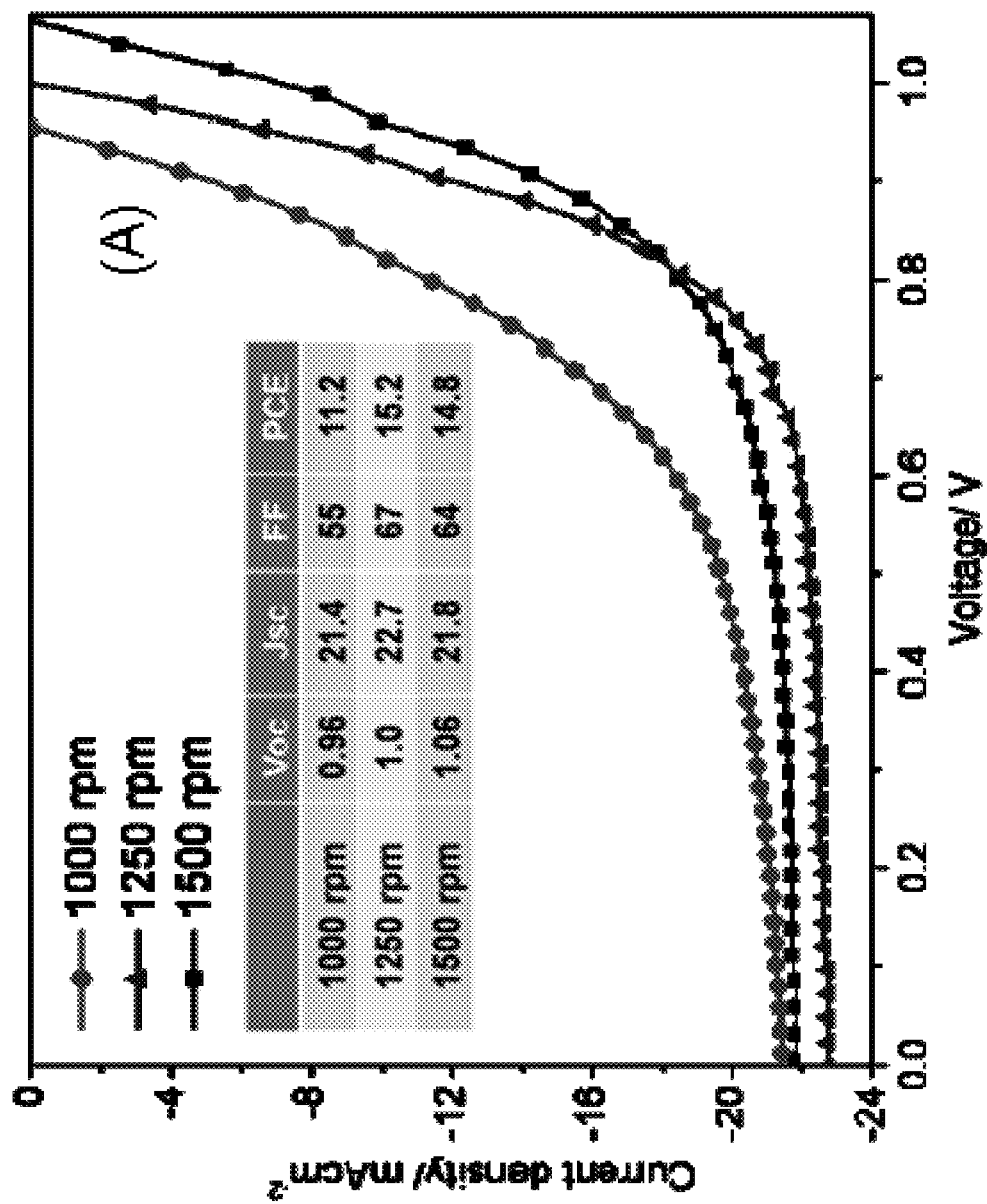
FIG. 8 shows optimization of the devices with HCl additive: (A) optimization of the $PbI_2$ thin thickness, and (B) optimization of HCl acid concentration in $PbI_2$ DMF solution according to an embodiment of the presently claimed invention.
Figure 8:
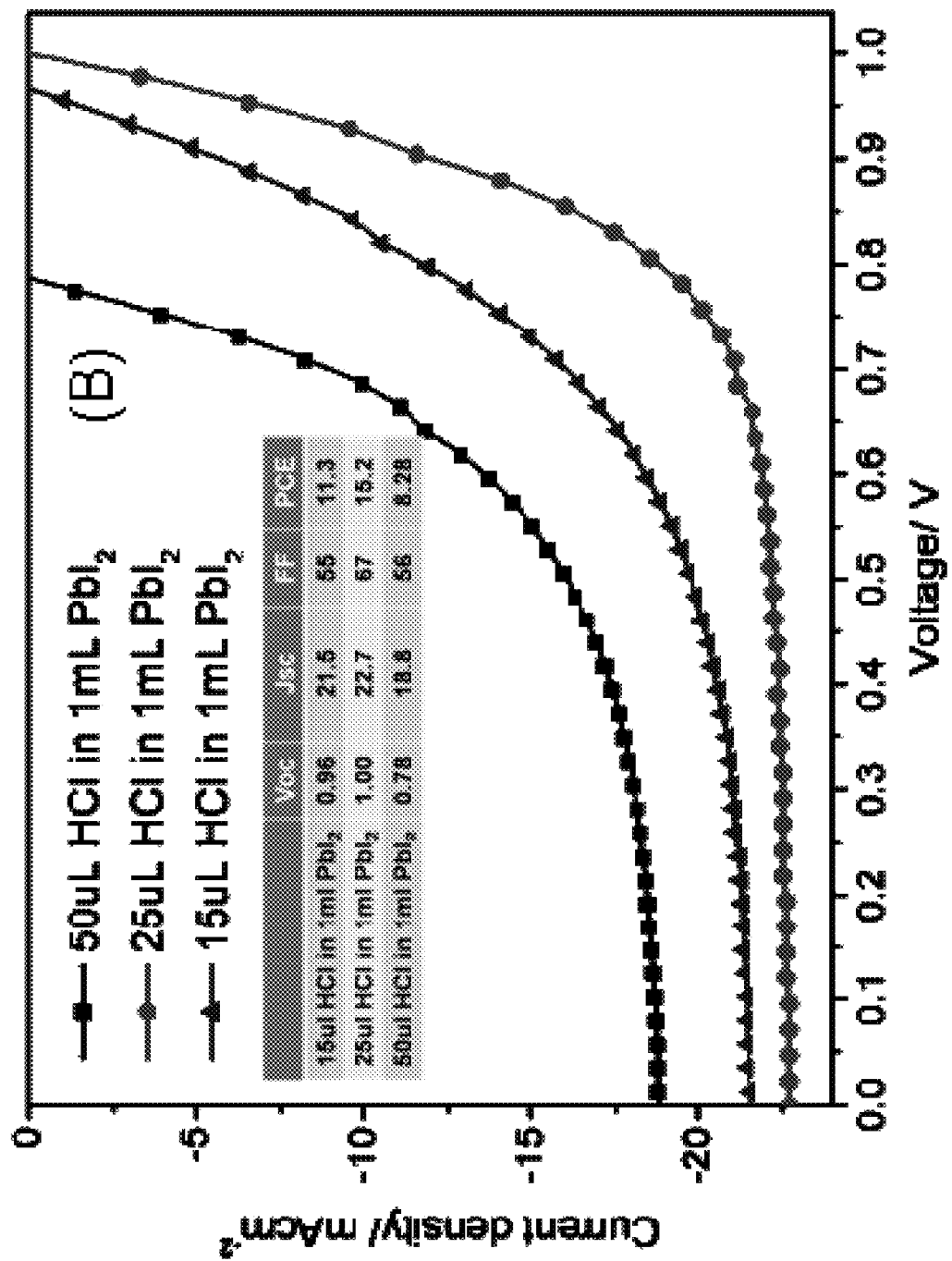
Figure 9:
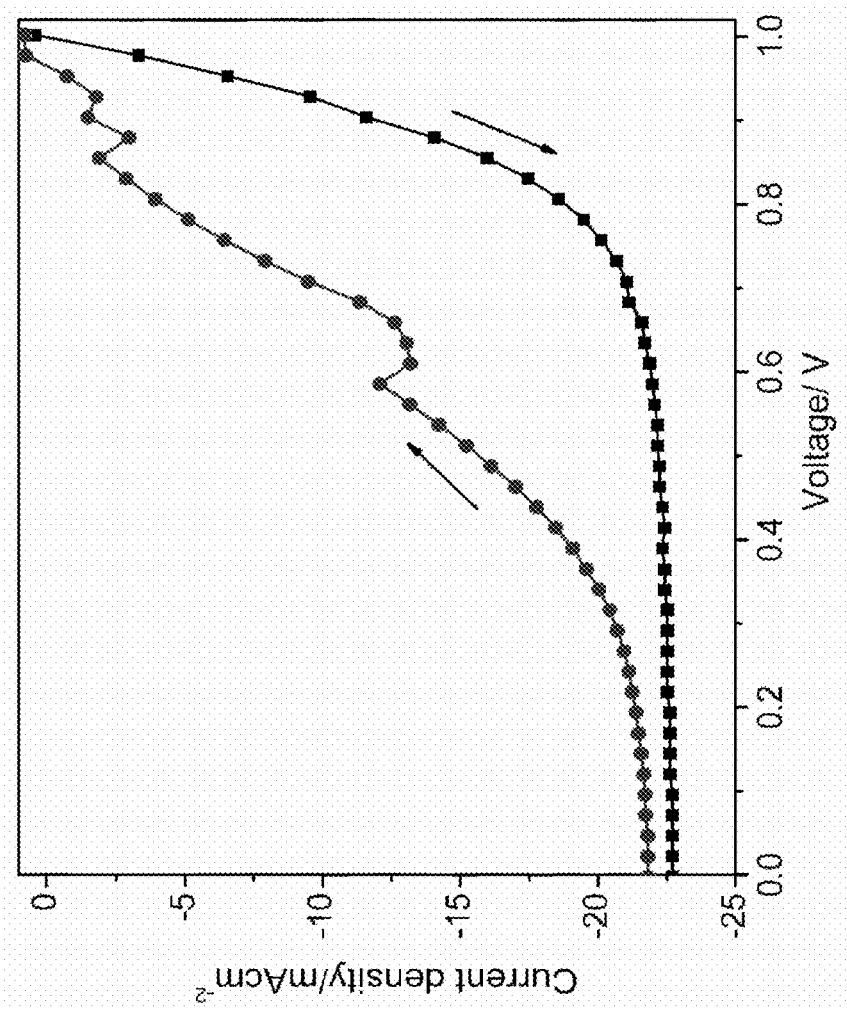
FIG. 9 shows a hysteresis loop for J-V measurement of perovskite solar cell at double bias swept mode according to an embodiment of the presently claimed invention.

These are based on measurements obtained under 100 mW/cm$^2$ AM1.5G standard solar spectrum. The device with 2.5 v. % HI additive reached a promising PCE of 12.17%, nearly 30% enhancement in PCE when compared with the control device (9.35%). On the other hand, a high efficiency of 14.8% was obtained from the device with 2.5 v. % HCl additive, an impressive 58% enhancement when compared with the pristine device. It is worth noting that the improved performance (30%) by introducing HI is mainly due to increased short current density ($J_{SC}$) from 18.94 to 22.02 mAcm$^{-2}$. However, further improved PCE (58% enhancement) in the device with HCl additive is attributed not only to the increased $J_{sc}$ but also to the improved open-circuit voltage ($V_{oc}$) from 0.87 to 1.06V. A staggering high efficiency of 15.2% has been obtained in FIG. 7B, upon further optimizing the thickness of the perovskite layer and concentration of HCl additive. The optimization on layer thickness by changing spincoating speed and hysteresis phenomenon during test measurement are depicted in FIG. 8 and FIG. 9, and the forward bias to short circuit scan between two curves was taken for the PCE value because it gives a close estimate for the "steady-state" efficiency. This significant enhancement in performance with use of additives should be attributed to the improved thin-film quality, which provide uniform coverage of the TiO$_2$ dense layer thereby maximizes energy harvesting and minimizing shortcutting due to voids in the dense layer.

Figure 6:
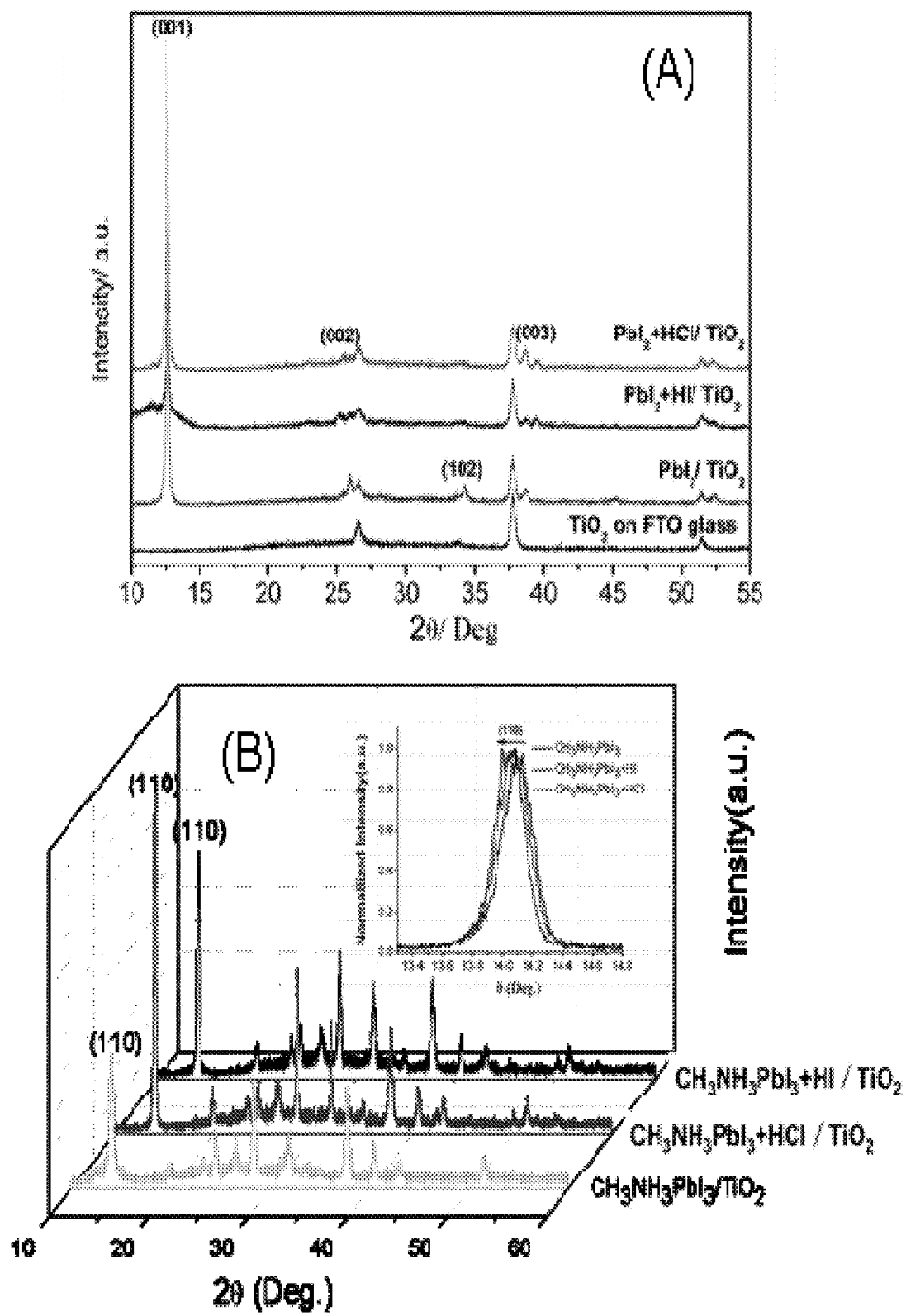
FIG. 6 shows (A) XRD patterns of $PbI_2$ thin films on the $TiO_2$ dense layer coated on FTO glass, and (B) XRD patterns of the solution-processed perovskite thin films, pristine perovskite, the perovskite with HI added, and the perovskite with HCl added, the insert shows the shift of (110) peak according to an embodiment of the presently claimed invention.
Figure 10:
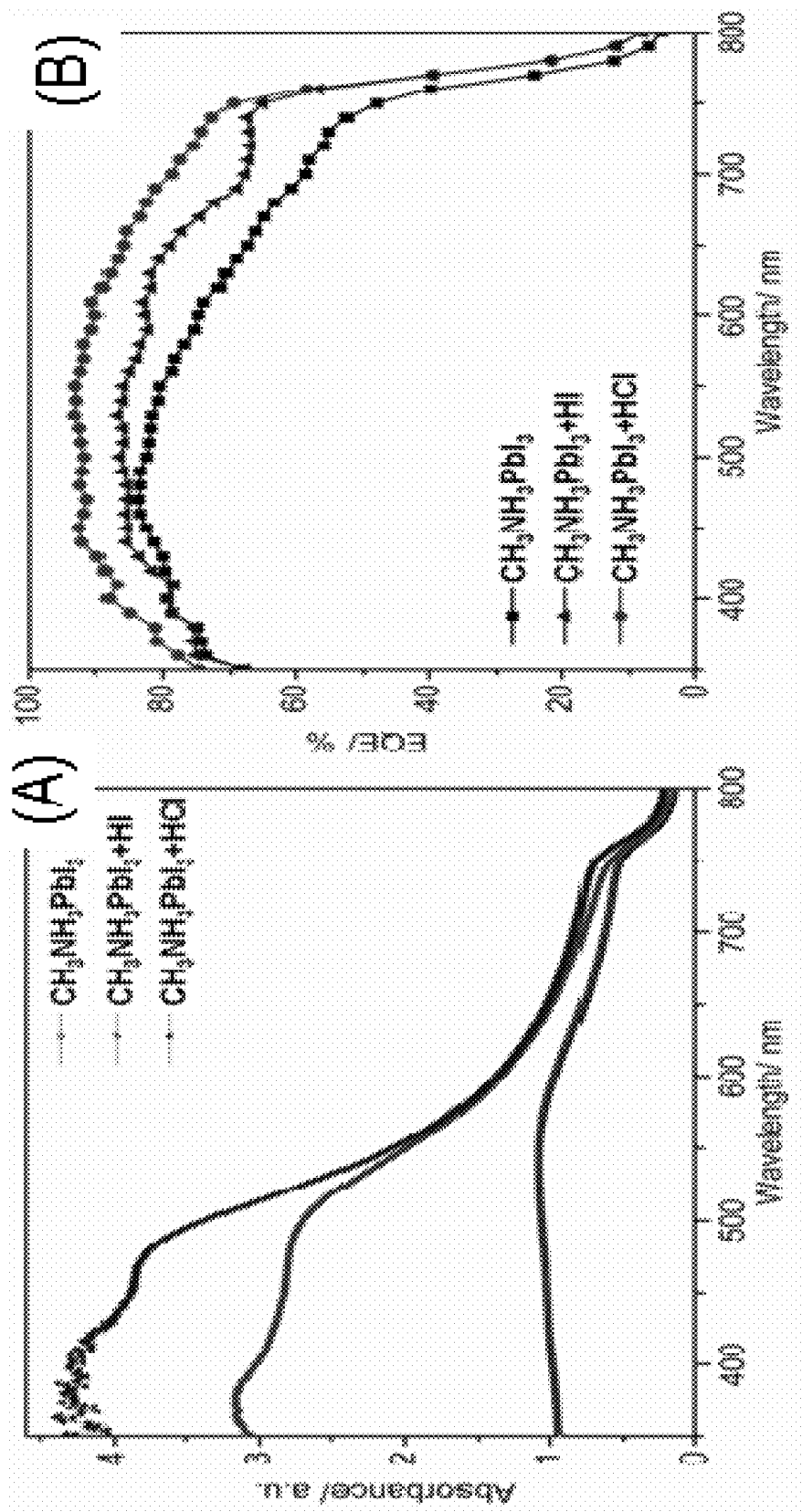
FIG. 10 shows (A) Uv-vis absorbance spectra, and (B) external quantum efficiency (EQE) according to an embodiment of the presently claimed invention.
Figure 11:
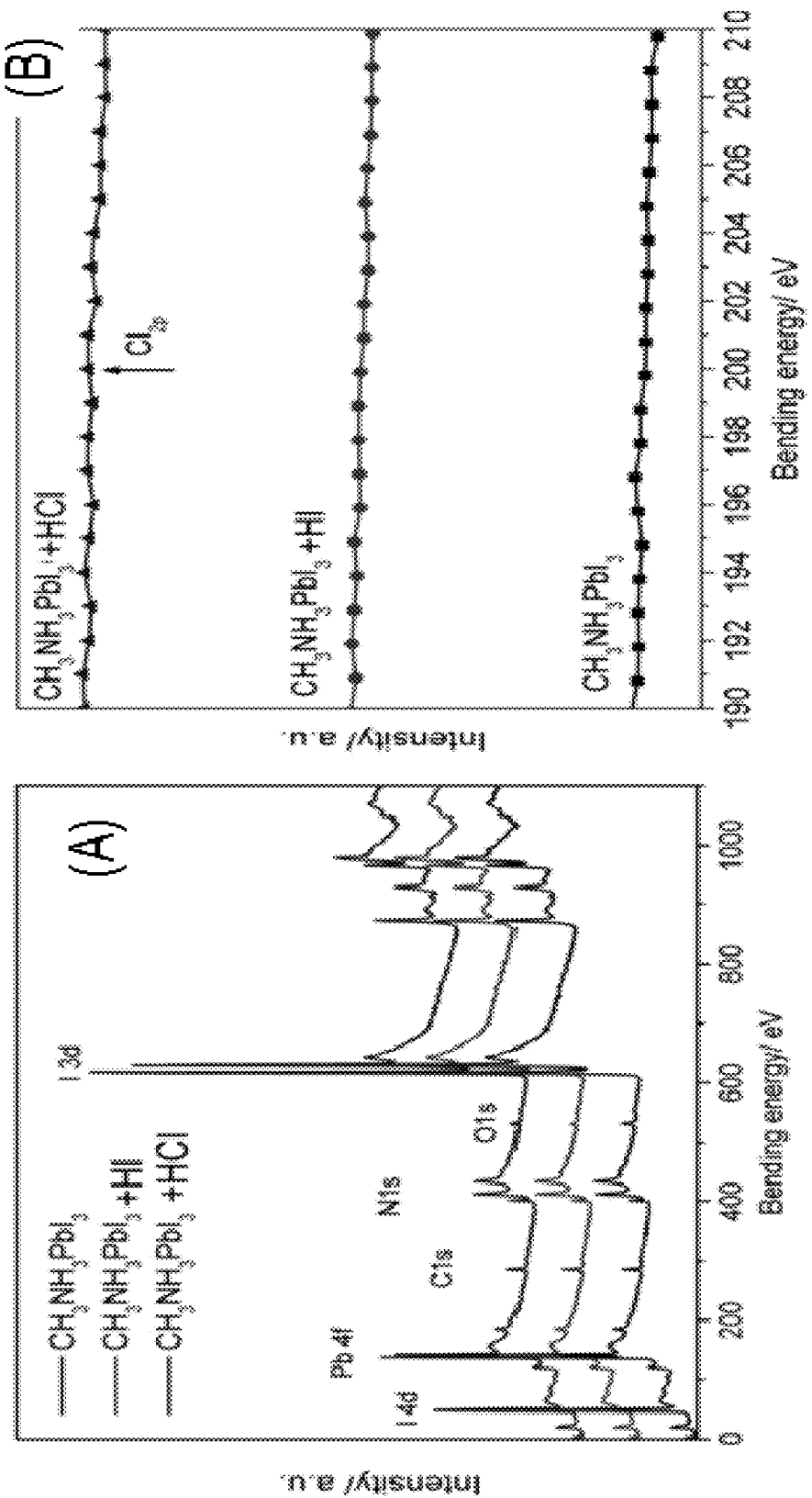
FIG. 11 shows (A) XPS analysis on the perovskite layers, and (B) XPS between 190 and 210 eV according to an embodiment of the presently claimed invention.

The improved thin-film quality and uniform crystals in the perovskite layer with halogen acid additives can further enhance solar absorbance. Three types of thin film, pristine perovskite, perovskite with HI and HCl additives, respectively, were prepared on TiO$_2$ dense layer by the same procedure, indicating that they have approximately the same thickness. In FIG. 10A, the absorbance of the perovskite thin films reveals a sequential increase over the entire visible solar spectrum range from the reference sample, the perovskite with HI additive, to the perovskite with HCl additive. This is consistent with the increased performance of external quantum efficiency (EQE) as shown in FIG. 10B. The increased absorbance can be contributed to the improved surface coverage and crystallinity of perovskite thin films with additives. The improved crystallinity can be observed in XRD pattern (FIG. 6B). The intensity of the main peak (110) of CH$_3$NH$_3$PbI$_3$ at 14.11° shows a remarkable increase by introducing additives (both HI and HCl). A close examination of the main peak (110) reveals a blue-shift due to HCl additive (insert of FIG. 6B). This is probably attributed to the introduction of Cl atoms in the CH$_3$NH$_3$PbI$_3$ lattice causing an expansion of the lattice structure, despite Cl cannot be detected by the XPS measurement, as seen in FIG. 11.

Figure 12:
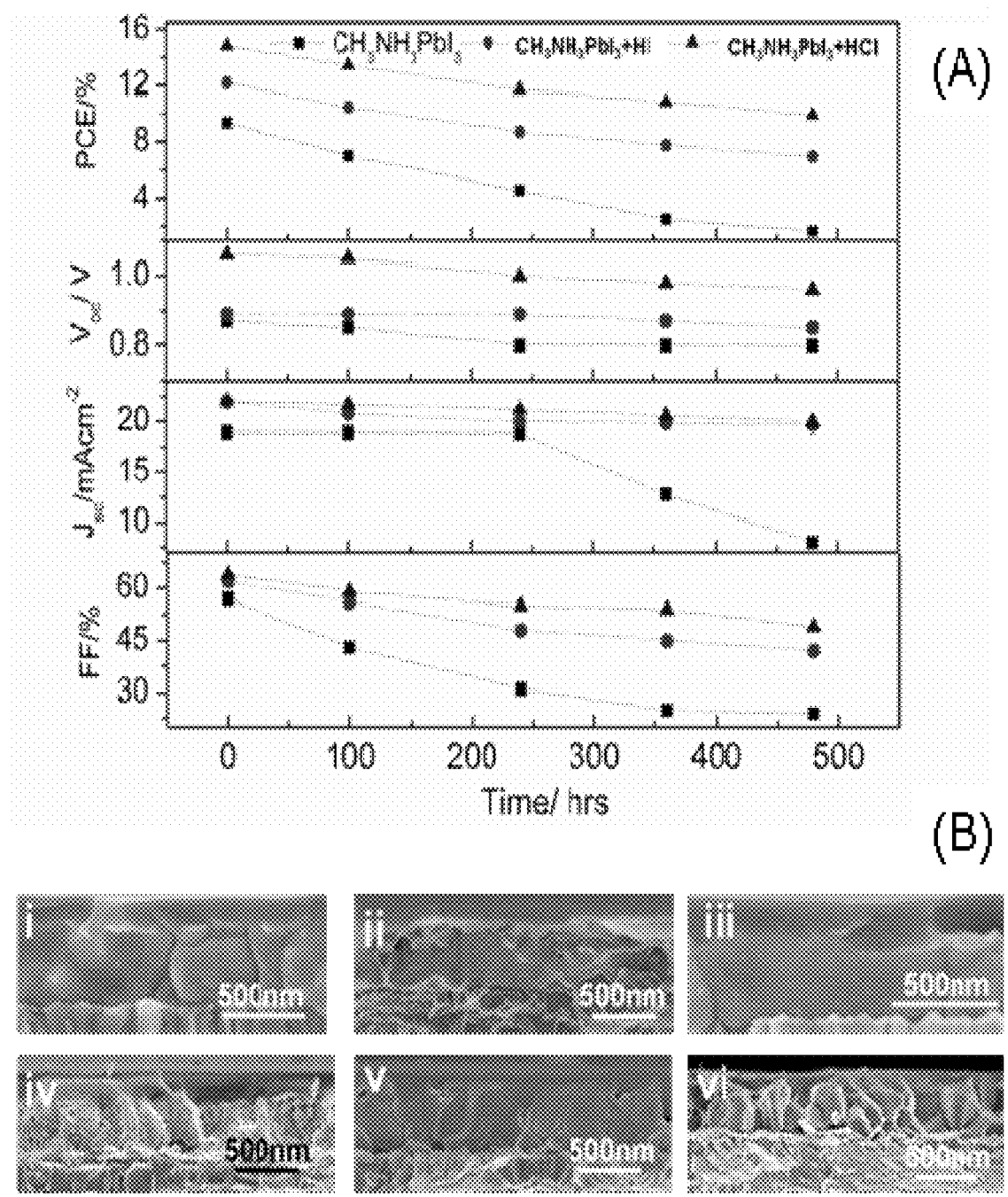
FIG. 12 shows (A) stability on performance of the solution-processed planar heterojunction perovskite solar cells exposed in air at room temperature and over 80 RH %, and (B) the cross-section SEM images, i-iii the freshly prepared devices, respectively, of pristine perovskite, the perovskite with HI added, and the perovskite with HCl added; iv-vi, the correspondent devices are exposed to air with 80 RH %, without encapsulation, after one week according to an embodiment of the presently claimed invention.

It has been demonstrated that improvement of the perovskite thin film coverage, uniformity and crystallinity can be realized by introducing halogen acid additives, i.e. HCl and HI especially the former. As a new organic-inorganic hybrid perovskite member in the photovoltaic family, the stability of device is an important issue for its potential application. Furthermore, the introduction of Cl atoms is expected to improve the stability of CH$_3$NH$_3$PbI$_3$ due to the larger electron negativity of chloride element as compared to that of iodide element. It strengthens the metal-halogen bond and keeps the material more stable. The longitudinal follow-up on the photovoltaic parameters of devices without and with HI/HCl additives can be found in FIG. 12A. These devices are encapsulated simply by the epoxy glue covered with glass slides and maintained in air at room temperature and over 80 RH %. It is well known that perovskite material is sensitive to water vapor. Monitoring the test devices under relatively high humidity environment facilitates the investigation into the stability of device in an accelerated time frame. The device with additive shows some degraded PCE value over 500 hours, 43% for HI additive and 35% for HCl additive; however, the performance of pristine perovskite solar cell decreases 50% after 250 hours, and 82% after 500 hours. Besides PCE, other important photovoltaic parameters evolution can also be observed in FIG. 12A. These include the degradation of $J_{sc}$ and fill factor (FF) over time, which are the major reasons for decrease of PCE. It is to be expected that the mobility dropped off as a result of deterioration on the perovskite thin film quality. It means that perovskite with additive not only improves the thin film quality but also enhances the stability of the device, especially with HCl additive. To get an in-depth understanding of improved stability of the device, time resolved morphology were carried out and recorded with cross-sectional SEM, as present in FIG. 12B. FIG. 12B i-iii are cross-section SEM images of fresh samples corresponding, respectively, to pristine perovskite, perovskite with HI additive, and perovskite with HCl additive; while FIG. 12B iv-vi are corresponding SEM images of these samples in air without encapsulation after one week. It can be clearly seen that the pristine perovskite crystals degraded into crystals with "stripes or streaks" on their surfaces. The perovskite domains with HI additive changed slightly; while the perovskite domains with HCl additive seemed unchanged in an identical environment. This interesting observation can be further supported by the XPS measurement (Table 3). The atomic concentration of oxygen (from environment, i.e. $O_2$ and $H_2O$ in air and XPS chamber) in perovskite thin film is as much as 50% lower than pristine perovskite thin film. The lower is the water vapor level, the better is the stability of perovskite material. Therefore, the perovskite crystals with HCl additive seem to be more stable; and this provides a simple and effective means to improve the device stability at the material level.

TABLE 3

| | $CH_3NH_3PbI_3$ | $CH_3NH_3PbI_3$ + HI | $CH_3NH_3PbI_3$ + HCl |
|---|---|---|---|
| Atomic Conc. % of O 1s | 9.27 | 4.13 | 4.78 |
| Atomic Conc. % of N1s | 14.77 | 14.40 | 15.71 |
| Atomic Conc. % of C 1s | 28.29 | 32.78 | 27.36 |
| Atomic Conc. % of Pb 4f | 11.26 | 11.60 | 12.47 |
| Atomic Conc. % of I 4d | 36.42 | 37.09 | 39.68 |
| Atomic Conc. % of Cl 2p | | Cl cannot be detected | |

EXAMPLE 1

All the fabrication processes were taken in the glove-box that is filled with nitrogen and with less than 1% relative humidity level. Devices were fabricated on the laser etched FTO glass substrates with a sheet resistance of 10~15 $\Omega$/square. The substrates were cleaned by ultrasonication in soap water, DI water, acetone, 2-propanol, and subjected to an UV-ozone treatment for 30 min. An approximate 30 nm thick dense $TiO_2$ was spin-coated on the substrates by using a 0.15M titanium isopropoxide (TIP) ethanol solution at a speed of 3000 rpm for 30 seconds. Subsequently, the sample was calcinated at 450° C. for 2 hours, in which a slowly heating-up and cooling-down procedure was adopted.

$PbI_2$ was dissolved in N,N-dimethylformamide at a concentration of 461 mg/ml under stirring at 70° C., which is maintained during the entire fabrication process. After filtration with 0.25 $\mu$m pore size filter, the $PbI_2$ layer was deposited by spin-coating on the $TiO_2$ dense layer coated substrates with 1000-1500 rpm for 30 seconds, and dried at 70° C. for 30 mins on hot plate. Subsequently upon cooling down to room temperature, the $PbI_2$ coated substrates were immersed in the organic part $CH_3NH_3I$ solution (30 mg/ml in 2-propanol) for 90 seconds to complete the reaction. Finally, a rinsed step with 2-propanol was required for removing the excess organic fraction and the resulting sample was dried at 90° C. for 60 min.

The HTL was subsequently deposited by spin-coating at a speed of 4000 rpm for 30 seconds. The HTL solution was prepared by dissolving 79 mg of Spiro-MeOTAD, 28.8 $\mu$l of 4-tert-butylpyridine, 17.5 $\mu$l of a 520 mg/mL lithium bis(trifluoromethylsulphonyl)imide in acetonitrile in 0.99 ml chlorobenzene. The HTL coated substrates were kept overnight before depositing the counter-electrode.

Finally, a 100 nm silver with 15 nm $MoO_3$ were thermally evaporated on top of these devices through the shadow mask with an effective area ranging from 0.1 $cm^2$ to 0.25 $cm^2$. The device area corresponding to best performance was 0.12 $cm^2$.

EXAMPLE 2

0.92 gram of $PbI_2$ is dissolved in 2 mL of DMF (Dimethylformamide) solvent. 50 micro liter of HCl is added to the above to improve the solubility and suppress precipitation into elongated crystals during spincoating. Therefore, the ratio of HCl to $PbI_2$ solution is 25:1000. 50 micro liter of the above mixture is spincoated on the dense layer. 30 milligram of MAI ($CH_3NH_3I_x$) is dissolved in 1 milli liter of isopropanol, after well-mixed 100 micro liter of this MAI mixture is spincoated onto the dried inorganic part. The above is annealed (heated) at 90 deg C. for 2 hour to promote reaction to form the perovskite layer. The excess (2 organic mixture by volume over 1 inorganic mixture by volume) organic part is rinsed with isopropanol. The excess MAI solution is to ensure that all the inorganic part ($PbI_2$) has been totally reacted with the organic part (MAI).

(A) Solid-Layer Configuration

A1. Film-Quality Control

Figure 13:
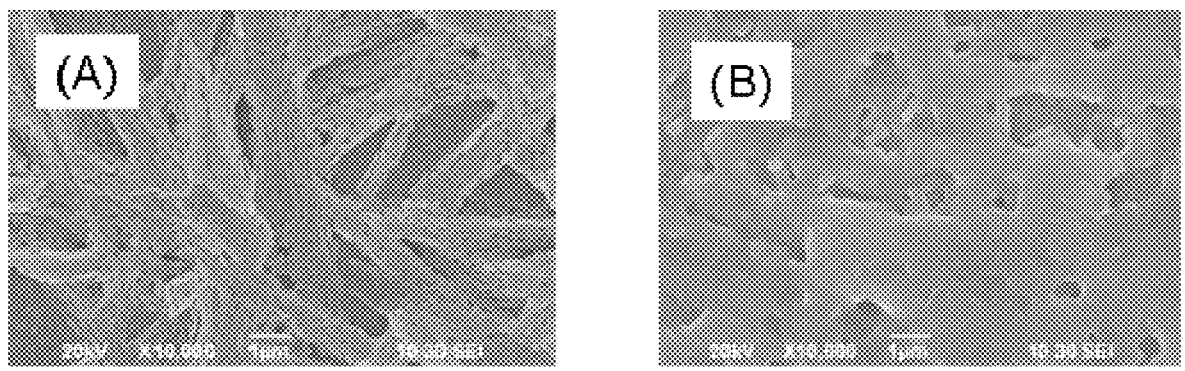
FIG. 13 is SEM images showing (A) inorganic phase ($PbI_2$) added to the FTO glass with the dense layer, and (B) organic phase ($CH_3NH_3PbI_3$) according to an embodiment of the presently claimed invention.

The perovskite is deposited onto the dense $TiO_2$ in two steps. First the inorganic $PbI_2$ is introduced to the fluorine doped tin oxide (FTO) glass with the dense $TiO_2$ layer, subsequently the organic phase $CH_3NH_3I$ is added, and chemical reaction takes place resulting in perovskite layer $CH_3NH_3I$ formation. One striking aspect is that the $PbI_2$ crystal has a rod shape with about 1 micron in diameter by several to ten's of micron in length. After deposition, despite forming several layers onto the FTO glass, there are void spaces on the glass not being covered by the $PbI_2$ crystals as seen in FIG. 13A. There are also interstitial pores between neighboring rod-like crystals as well. After organic phase is added to the inorganic phase, perovskite is formed. A close examination in FIG. 13A reveals that the uncovered area on the FTO glass as well as the pores formed between the crystals still exists. The areas on the FTO glass not covered by the perovskite crystals will not pick up light and generate electrons. As such, this reduces the efficiency of the solar cell. In addition, this void areas may be filled with hole transfer materials (HTM) and photogenerated electrons may recombine with the HTM resulting in lower FF, which again affects efficiency.

Figure 14:
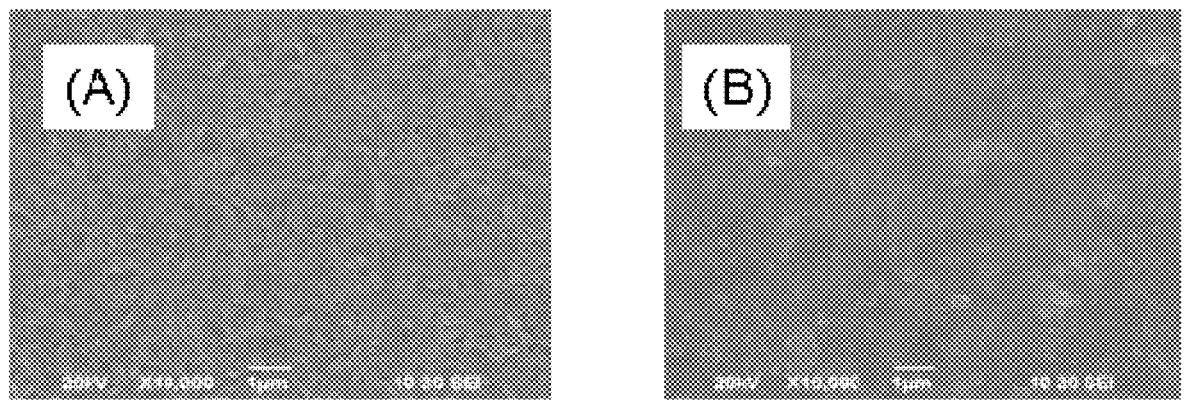
FIG. 14 is SEM images showing (A) inorganic phase ($PbI_2$) added together with HI to the FTO glass with the dense layer, and (B) organic phase ($CH_3NH_3PbI_3$) with HI according to an embodiment of the presently claimed invention.

The present innovation is to improve the "wettability" (i.e. reducing the wetting angle of the solution) of the $PbI_2$ onto the $TiO_2$ dense layer providing more coverage of the surface area, as well as reducing interporosity of the inorganic $PbI_2$ crystals. Both aspects require a modification of the morphology of the $PbI_2$ crystals. The present invention is to provide a chemical reactant, preferably a simple "compatible" acid, such as HI, HBr, HCl, etc. Hydrogen iodide which is extremely soluble in water in aqueous form is hydroiodic acid (or hydriodic acid). It is mixed with $PbI_2$ in solution and spin-coated onto the dense layer. A SEM picture of the coated $PbI_2$ and HI is shown in FIG. 14A. There, it can be seen that there is much more area coverage of the FTO glass with the dense $TiO_2$ layer. Second, the long needle-like, or rod-like, structure with large length-to-diameter ratio (L/D ratio 10× and above) has been modified to more like 2-3×. Given the smaller aspect ratio of the needles, it can provide more coverage of the glass and there is less pores formed between crystals as evident in FIG. 14A. Upon addition of the organic phase, perovskite crystals $CH_3NH_3PbI_3$ (with HI) are formed as seen in FIG. 14B. The morphology changes from short rods to more round and amorphous shape. This shape provides better coverage of the FTO glass with the dense layer and also reduces the porosity between neighboring perovskite crystals.

Figure 1:
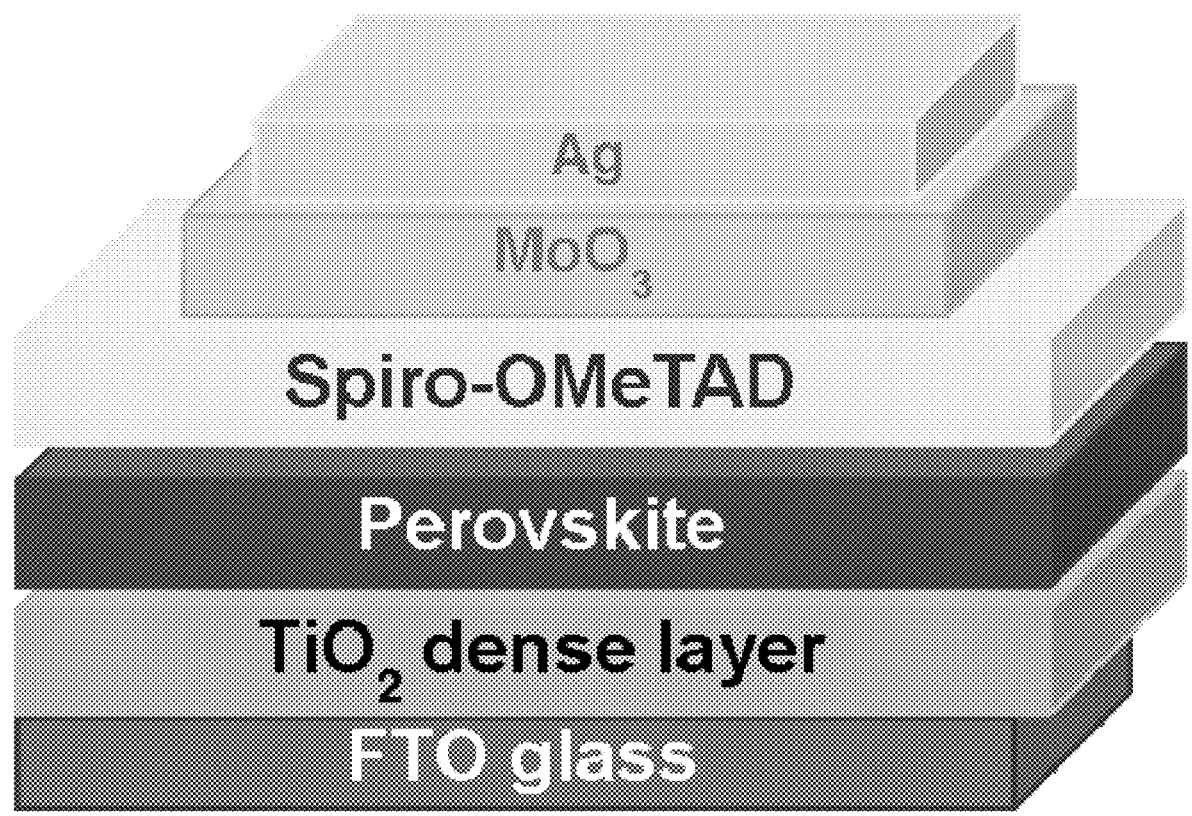
FIG. 1 depicts an architecture of perovskite-based solar cell in prior art.

This ideal case is more-or-less being approached by having a thick, uniform-height, perovskite dye layer deposited onto the dense layer of the FTO glass as shown in FIG. 1.

A2. Doping

Another possible improvement that can be made on the perovskite solar cell is to add a dopant to the perovskite so that it can enhance the absorption of the solar spectrum and also increase the electron transport property.

(i) Increase Solar Absorption Spectrum

By addition of halogen such as $I^-$, $Br^-$ and $Cl$, it is possible to increase the absorption of the light in a certain wave length. Given halogen reacts with water to form acids, HI (hydroiodic acid), HBr (hydrobromic acid), HCl (hydrochloric acid), it is the best to use these halogens in form of acids added to the perovskite during formation of the crystals. For example, iodine solid appears as a bluish black solid. In gas phase, it appears as purple as a result of its absorption of visible light and making transition between the HOMO (highest occupied molecular orbital) and LUMO (lowest unoccupied molecular orbital) levels.

Figure 15:
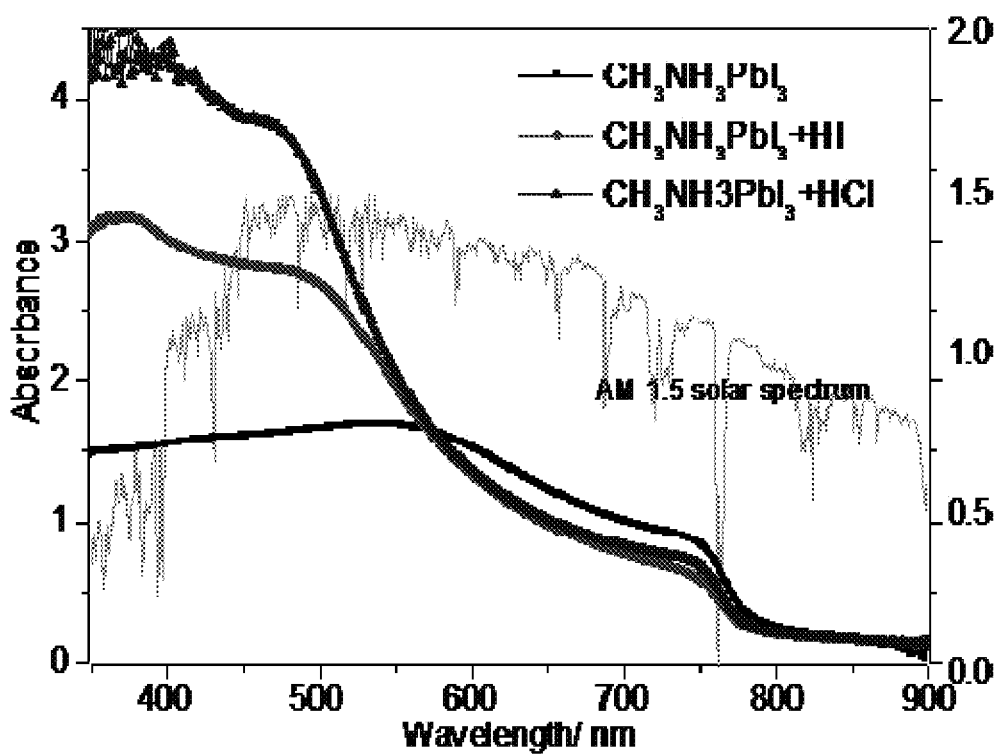
FIG. 15 is an absorption spectra for perovskite without and with HI and HCl addition according to an embodiment of the presently claimed invention.

FIG. 15 shows the absorption spectra, respectively, of perovskite, perovskite with HI and perovskite with HCl. FIG. 15 shows clearly that the absorption of the three are nearly the same for wavelength greater than 570 nm, the absorption of perovskite with HCl is highest rising to 4 units of absorbance at 350-nm wavelength as compared to 1.5 units for just the perovskite. The absorption of perovskite with HI doubles that of the perovskite at 350-nm wavelength.

(ii) Increase Electron Diffusion Length

Another effect of the dopant is to increase the diffusion length of the electrons. This phenomenon has been reported by Snaith [1]. However, $PbCl_2$, which is difficult to dissolve, was used in Snaith's recipe.

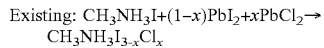

$$\text{Existing: } CH_3NH_3I + (1-x)PbI_2 + xPbCl_2 \rightarrow CH_3NH_3I_{3-x}Cl_x$$

Therefore only limited amount of $PbCl_2$, as restriction by physical dissolution, can be used. This may be far from the optimal dose. A novel solution is to introduce chloride to perovskite for doping to increase the diffusion length by using hydrochloric acid, HCl.

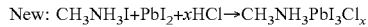

$$\text{New: } CH_3NH_3I + PbI_2 + xHCl \rightarrow CH_3NH_3PbI_3Cl_x$$

The amount of HCl to be added is not restricted by physical solubility, as HCl is highly soluble in aqueous phase. Therefore, chloride dopant in the perovskite is not limited as with the existing technology using $PbCl_2$. Also, the present invention avoids adding too much lead to the dye.

Although it is not new to increase the electron diffusion length using the dopant, it would certainly be novel if one dopant can increase both the absorption spectra as well as the diffusion length of the electrons. The halogen acids are possible candidates meeting these criteria.

A3. All-Solution Processing

The conventional thin-film solar cells such as CdInGaSe (CIGS) and CdTe use vacuum processing which is expensive. On the other hand, the solid layer perovskite solar cells use vapor deposition, which is expensive and difficult to extend to large scale. An innovation suggested herein is to use "all-solution processing", which lends itself to inexpensive, large-scale, production, which is extremely attractive for commercializing the technology.

These include: (1) spin coating the $TiO_2$ dense layer onto the FTO glass; (2) spin coating the inorganic portion of the perovskite onto the dense layer; (3) dip casting the organic fraction onto the already deposited inorganic fraction to form the perovskite; (4) spin coating the HTM (such as spiro-OMeTAD) onto the perovskite; and (5) spraying using airbrush a solution containing silver nanowires together with graphite on top of the HTM to form a counter electrode.

A4. Semi-Transparent Solar Cell

Given the counter electrode is formed in section A3. From spraying using airbrush, the counter electrode together with the photoanode is quiet thin (about 100-1000 nm), as such the solar cell is semi-transparent with a tint of purple color from the perovskite dye. This allows the solar cell to be mounted on windows of buildings and vehicles for light harvest, which is extremely attractive, in contrast with conventional and other thin-film solar cells, which are non-transparent. This also contrasts with the perovskite solar cells where the counter electrode is formed from vapor deposition, which forms an opaque surface, non-transparent to light.

A5. Improve Stability with Chloride

It is important to improve the stability of the perovskite by using a "stabilizer" so that the light harvesting capacity of the dye does not decrease over periods of months or years. Chloride doping is perhaps an important stabilizer.

A6. Dense Layer Substrate

Apart from using $TiO_2$ dense layer as the substrate, zinc oxide (ZnO) substrate can also be used in this electron transfer layer due to having higher conductivity. Therefore, the present invention could have very well incorporated the dense layer made of ZnO as the substrate for fabricating the perovskite solar cells.

A7. Performance of Solid-Layer Solar Cells

Figure 16:
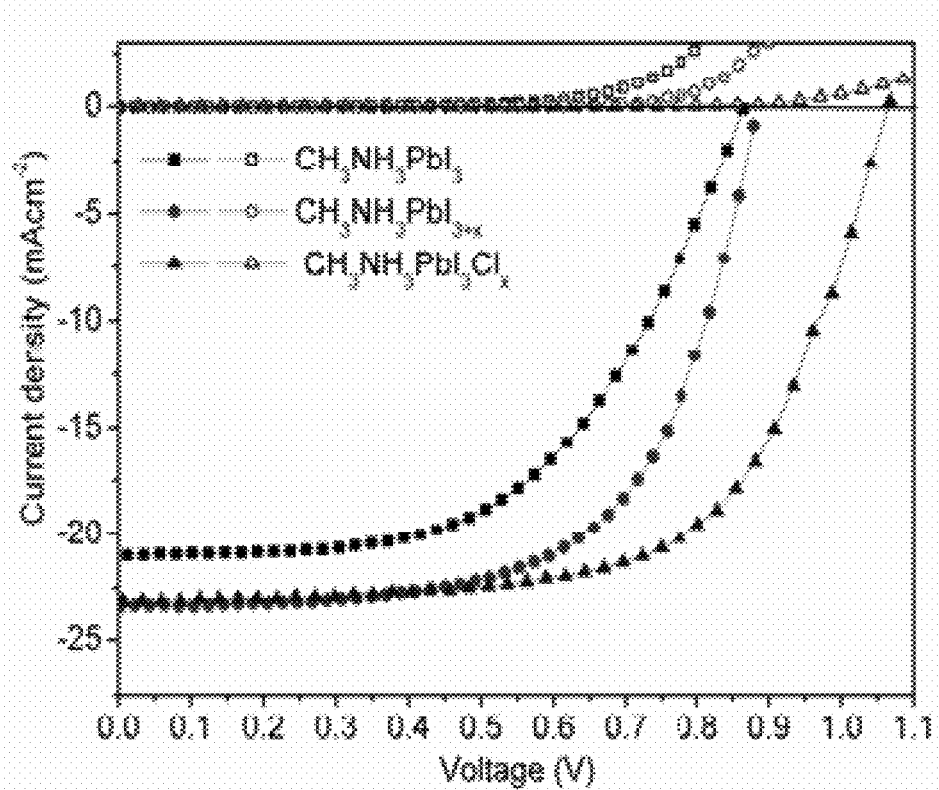
FIG. 16 is a graph showing J-V curve for perovskite cell without acid addition and respectively with HI and HCl added according to an embodiment of the presently claimed invention.

Some preliminary tests have confirmed the suggested novelties as discussed. Table 4 and FIG. 16 shows that the solar cell using HI improves the film quality and absorbance, resulting in a 30% increase in PCE resulting in PCE 12.9%. However, with HCl a 58% increase can be obtained resulting in PCE of 15.7%. This indeed researches the world record (Kelly [4] February 2014) where ZnO was used as the dense layer. (It is known that ZnO has higher conductivity. If the present technology is used with ZnO being the dense layer, the projected performance would have been even higher.) However, the result is certainly impressive when $TiO_2$ is being used as the dense layer. The dark current also supports the PCE results. The highest electron recombination is seen with pristine perovskite, followed by perovskite plus HI, and the least electron recombination and the best PCE with perovskite plus HCl.

TABLE 4

Comparing a 0.1 cm² solar cell without and with additives added

|  | Voc | Jsc | FF/% | PCE/% | % inc. |
|---|---|---|---|---|---|
| Perovskite | 0.87 | 20.08 | 54 | 9.91 | NA |
| Perovskite + HI | 0.89 | 23.34 | 62 | 12.9 | 30% |
| Perovskite + HCl | 1.06 | 23.08 | 64 | 15.7 | 58% |

A performance test regarding the acid additive dosage on PCE, Jsc, and fill factor was conducted, in which PCE represents conversion efficiency, Jsc represents conversion photocurrent, and fill factor represent conversion effectiveness. 0.92 $PbI_2$ is dissolved in 1 mL of DMF solvent, and the test was performed under adding different amount of HCl solution into the $PbI_2$ solution. The results are shown in Table 5:

TABLE 5

|  | Voc | Jsc | FF | PCE |
|---|---|---|---|---|
| 15 µl HCl in 1 ml PbI$_2$ | 0.96 | 19.8 | 55 | 10.4 |
| 25 µl HCl in 1 ml PbI$_2$ | 1 | 22.7 | 67 | 15.3 |
| 50 µl HCl in 1 ml PbI$_2$ | 0.78 | 17.3 | 56 | 7.6 |

As shown in Table 5, the volume ratio of acid to PbI$_2$ solution with 25:1000 is an optimal value, comparing with the ratios of 15:1000 and 50:1000 since the PCE, Jsc, and fill factor are the largest under this optimal value. The result provides that having correct amount of acid additive is crucial in modifying the perovskite crystal lattice.

(B) Scaffold Configuration

B1. Nanofiber Scaffold with Micro-Sized Pores

Figure 17:
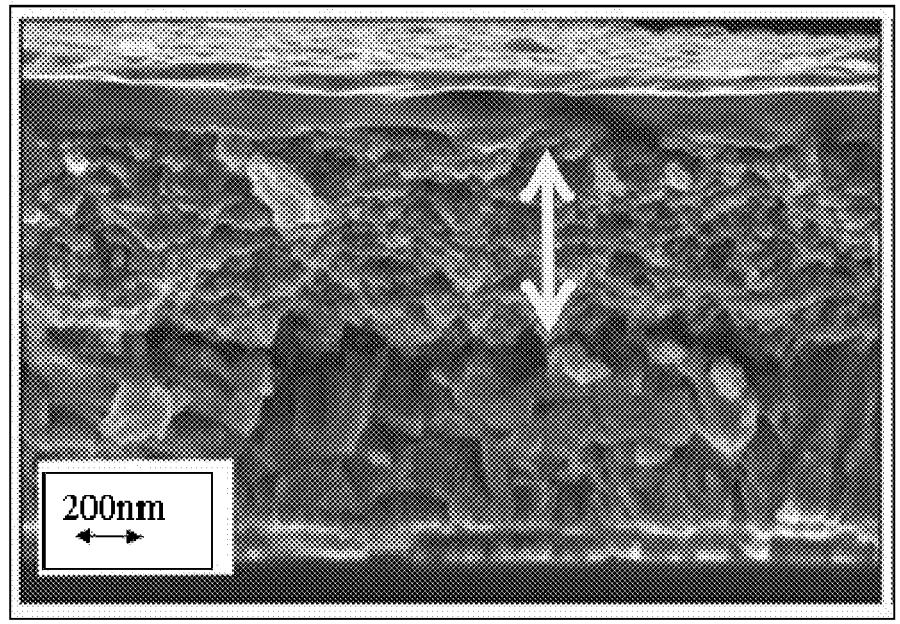
FIG. 17 is a SEM image showing mesopores and small domains formed from $TiO_2$ nanoparticles according to a prior art.

A mesoporous scaffold formed from TiO$_2$ nanoparticles of about 50 nm is used to house the perovskite, which forms small domains in these meso-scaled pores, see FIG. 17 reproduced from a prior art The present invention is to facilitate large domains of perovskite of micron size to be formed instead of the nano-sized domains for the perovskite crystals. Because of the smaller size, the latter has large grain boundaries and electrons may get lost recombining with the HTM at these boundaries. This problem can be avoided if larger domains of perovskite, with much reduced boundaries, are deployed using nanofibers with larger micron-sized pores, see FIGS. 18A and 18B using TiO$_2$ nanofibers. Also, with nanofibers, a micro-pore sized scaffold with thickness up to 1000-2000 nm can be formed allowing more light harvesting and taking advantage of the large diffusion length of perovskite halide.

Figure 18:
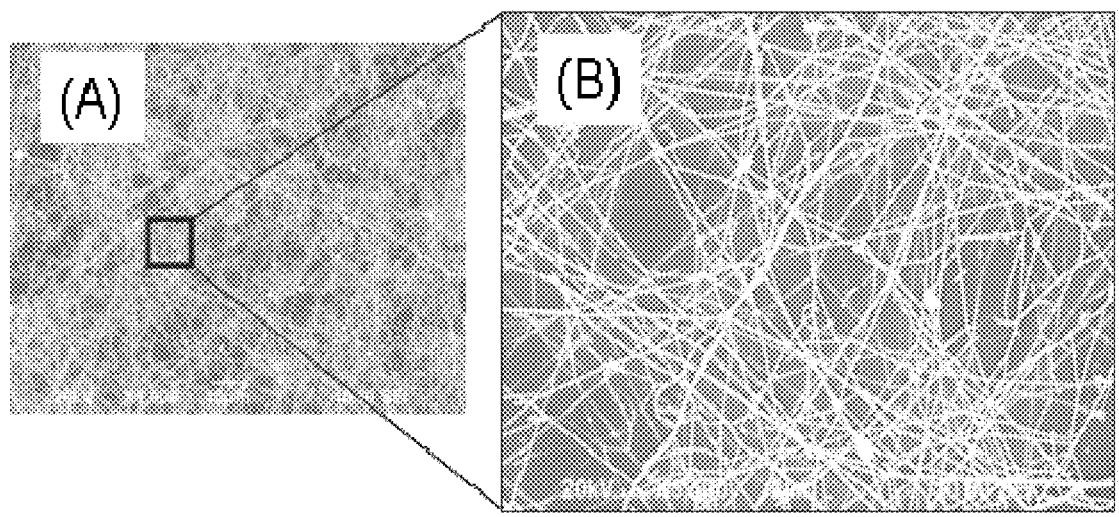
FIG. 18 is SEM images showing (A) $TiO_2$ nanofibers with micron-sized pores for housing the perovskite, and (B) the $TiO_2$ nanofibers with larger magnification according to an embodiment of the presently claimed invention.
Figure 19:
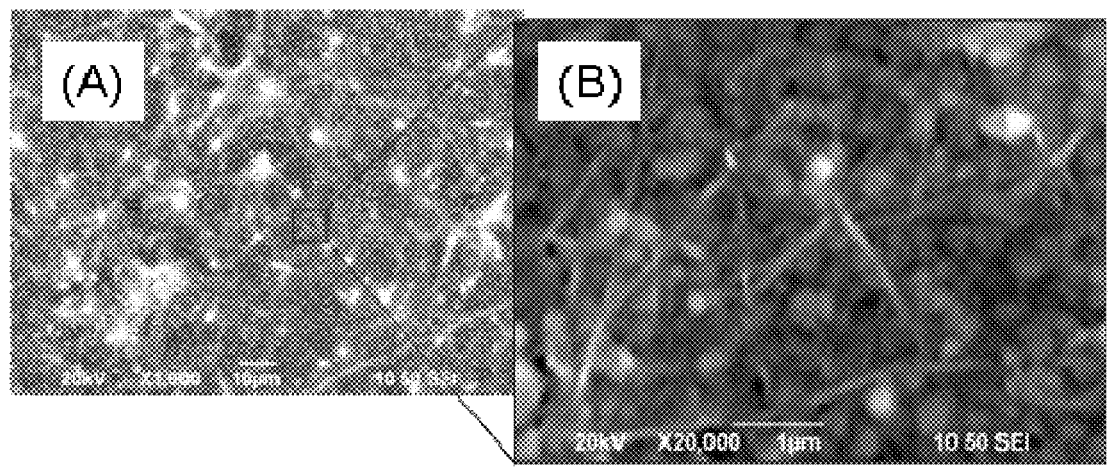
FIG. 19 is SEM images showing (A) $TiO_2$ nanofibers with micron-sized pores with embedded perovskite crystals, and (B) the $TiO_2$ nanofibers with larger magnification according to an embodiment of the presently claimed invention.

The scaffold in FIGS. 18A and 18B is formed from 60 kV, 30 s, 120° C., 15 min, after heating at 500° C. for 30 min. 40% of CH$_3$NH$_3$PbI$_3$ in DMF a 100 µL solution was applied at 30 PSI pressure to the scaffold using an airbrush. FIGS. 19A and 19B show the penetration of perovskite filling the large pores of the nanofiber web forming large crystal domains.

Figure 20:
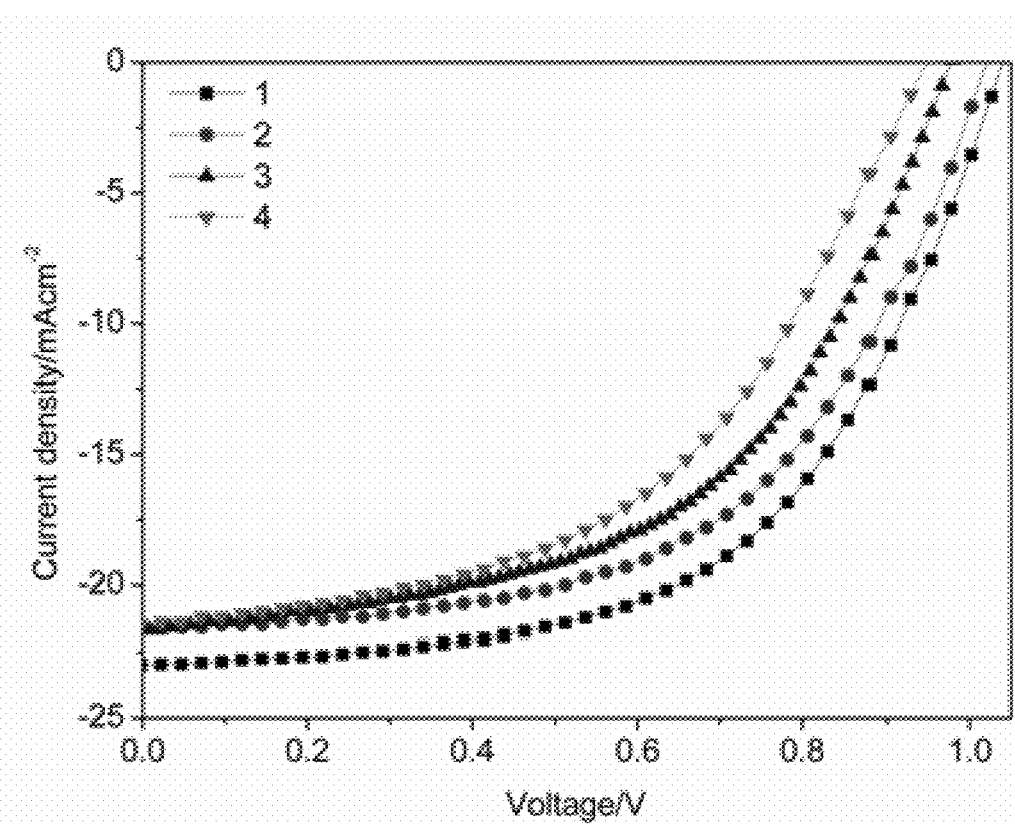
FIG. 20 is a graph showing the J-V curve for the $TiO_2$ nanofiber scaffold perovskite solar cell according to an embodiment of the presently claimed invention.

FIG. 20 and Table 6 shows the J-V curve for the TiO$_2$ nanofiber scaffold perovskite solar cell. The scaffold in is formed from 60 kV, 60 s after heating at 500° C. for 30 min. The four devices fabricated and measured in the same condition. From this J-V curve, it can be seen that the performance of four devices are similar, which indicate the repeatability of this kind of device is reliable. The highest efficiency is 13.44% with highest Jsc. An average of 12.02% PCE was obtained from these four devices.

TABLE 6 photovoltaic parameters of TiO$_2$ nanofiber scaffold solar cell

| Cells No | Voc/V | Jsc/mAcm$^{-2}$ | FF/% | PCE/% |
|---|---|---|---|---|
| 1 | 1.03 | 22.9 | 57 | 13.44 |
| 2 | 1.01 | 21.6 | 56 | 12.22 |
| 3 | 0.97 | 21.7 | 56 | 11.79 |
| 4 | 0.94 | 21.4 | 53 | 10.67 |

B2. CNT in Nanofiber Scaffold

Figure 21:
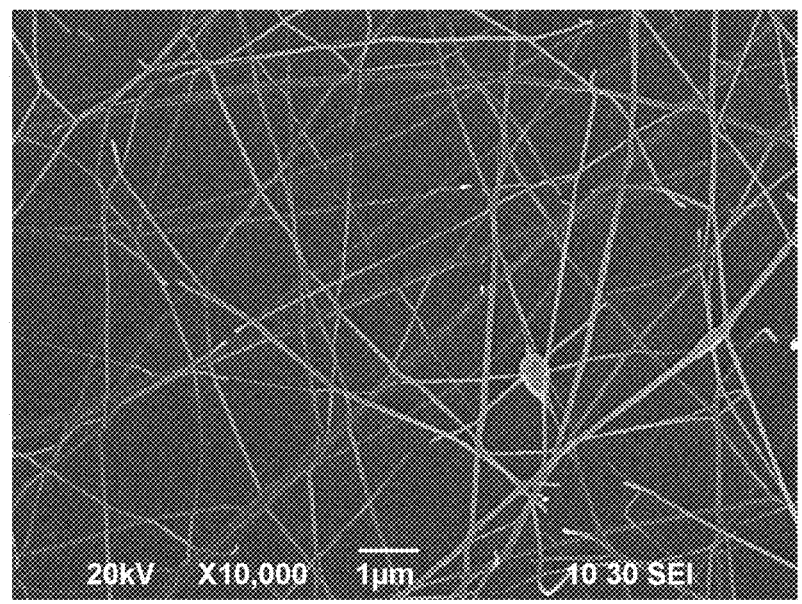
FIG. 21 is a SEM image showing $TiO_2$/CNT nanofibers with micron-sized pores for housing the perovskite according to an embodiment of the presently claimed invention.
Figure 22:
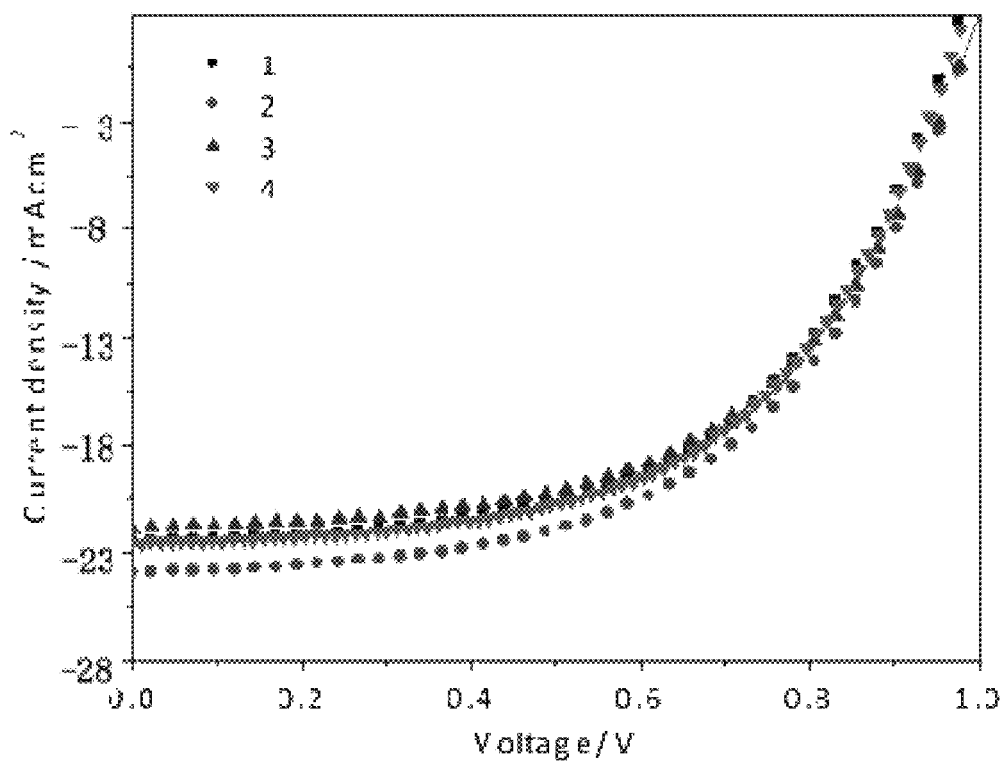
FIG. 22 is a graph showing J-V curve for CNT/$TiO_2$ nanofiber scaffold perovskite solar cell according to an embodiment of the presently claimed invention.

One additional innovation is to include carbon nanotube (CNT) in the TiO$_2$ nanofiber scaffold. FIG. 21 is a SEM image of TiO$_2$/CNT nanofiber scaffold with micron-sized pores. This can facilitate transport of photogenerated electrons from the perovskite to travel to the FTO glass without getting loss in the grain boundaries recombining with the HTM. FIG. 22 and Table 7 shows the J-V curve for the TiO$_2$/CNT nanofiber scaffold perovskite solar cell. The scaffold is formed from electrospinning at 60 kV, 60 s and after calcinating at 500° C. for 30 min. The four devices fabricated are measured under the same condition. From this J-V curve, it can be seen that the performance of four devices are similar, which indicates the repeatability and reliability of this type of device. The highest efficiency is 13.24% and an average of 12.72% PCE was obtained.

TABLE 7

|  | Voc/V | Jsc/mAcm$^{-2}$ | FF/% | PCE/% |
|---|---|---|---|---|
| 1 | 0.99 | 22.5 | 56 | 12.56 |
| 2 | 0.99 | 22.9 | 56 | 12.7 |
| 3 | 0.99 | 23.8 | 56 | 13.24 |
| 4 | 0.98 | 22.6 | 56 | 12.4 |

For the solid-layer perovskite solar cell, these improvements include (1) film control, (2) including suitable dopant for improving the absorbance and electron-diffusion length, (3) solution-processing, (4) semi-transparency using solution processed counter electrode, and (5) stabilizer. With the above means, the performance of the solar cells is improved including enhancement in cell efficiency, short circuit current density, and fill factor.

For the scaffold perovskite solar cell, (1) the scaffold can be formed from large-pores nanofibers to increase the perovskite domains and (2) CNT can be incorporated in the TiO$_2$ nanofibers to facilitate electron transport.

Apart from solar cell, the perovskite layer of the present invention is applicable for lasers and photoelectrolysis. For the latter, hydrogen gas can be produced as a fuel and oxygen can be produced for life support and combustion.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

REFERENCES

All references listed above are incorporated herein by reference in their entirety.

[1] Stranks et al., "Electron—hole diffusion lengths exceeding 1 micrometer in an organometal trihalide perovskite absorber", Science, Vol 342, Oct. 18, 2013.

[2] Burschka et al., "Sequential deposition as a route to high-performance perovskite-sensitized solar cells", Nature Letters, Vol 499, Jul. 18, 2013.

[3] Green, M. A. et al. Solar Cell Efficiency Tables (Version 45). Prog. Photovolt: Res. Appl., Vol 23, January 2015.

[4] Kelly et al., "Perovskite solar cell with a planar heterojunction structure prepared using room-temperature solution processing techniques", Nature Photonics, Vol. 8, February 2014.

What is claimed is:

1. A solar cell comprising a perovskite layer and a substrate, the pervoskite layer covering the substrate with 100% surface coverage;
    wherein the perovskite layer consists of an inorganic-organic perovskite material, the inorganic-organic perovskite material consisting of a lattice structure of CH$_3$NH$_3$PbI$_3$ and chloride (Cl) dopants introduced in the lattice structure;

wherein the perovskite layer is prepared by:
heating a mixture comprising a lead (II) iodide ($PbI_3$) solution and hydrochloric acid (HCl) on the substrate thereby forming a $PbI_3$ thin film consisting of hexagonal-plate shaped $PbI_3$ crystals on the substrate in view of the HCl, wherein the hexagonal-plate shaped $PbI_3$ crystals have a length-to-diameter ratio of 2:1 to 3:1; and a X-ray diffraction (XRD) pattern of the hexagonal-plate shaped $PbI_3$ crystals includes a peak from (110) plane and does not include a peak from (102) plane; and
depositing a $CH_3NH_3I$ solution on the $PbI_3$ thin film formed on the substrate and heating the deposited $CH_3NH_3I$ solution and the $PbI_3$ thin film thereby forming the perovskite layer; and
wherein the hexagonal-plate shaped $PbI_3$ crystals are formed in view of the HCl such that the perovskite layer is formed with the hexagonal-plate shaped $PbI_3$ crystals such that the perovskite layer covers the substrate with 100% surface coverage thereby increasing power conversion efficiency of the solar cell.

2. A solar cell comprising a perovskite layer and a substrate, the pervoskite layer covering the substrate with 100% surface coverage;
wherein the perovskite layer consists of an inorganic-organic perovskite material, the inorganic-organic perovskite material consisting of a lattice structure of $CH_3NH_3PbI_3$ and iodide dopants introduced in the lattice structure;
wherein the perovskite layer is prepared by:
heating a mixture comprising a lead (II) iodide ($PbI_3$) solution and hydrochloric acid (HI) on the substrate thereby forming a $PbI_3$ thin film consisting of hexagonal-plate shaped $PbI_3$ crystals on the substrate in view of the HI, wherein the hexagonal-plate shaped $PbI_3$ crystals have a length-to-diameter ratio of 2:1 to 3:1; and a X-ray diffraction (XRD) pattern of the hexagonal-plate shaped $PbI_3$ crystals includes a peak from (110) plane and does not include a peak from (102) plane; and
depositing a $CH_3NH_3I$ solution on the $PbI_3$ thin film formed on the substrate and heating the deposited $CH_3NH_3I$ solution and the $PbI_3$ thin film thereby forming the perovskite layer; and
wherein the hexagonal-plate shaped $PbI_3$ crystals are formed in view of the HI such that the perovskite layer is formed with the hexagonal-plate shaped $PbI_3$ crystals such that the perovskite layer covers the substrate with 100% surface coverage thereby increasing power conversion efficiency of the solar cell.

\* \* \* \* \*